US012593433B2

(12) United States Patent
Choi et al.

(10) Patent No.: US 12,593,433 B2
(45) Date of Patent: Mar. 31, 2026

(54) METHOD OF FABRICATING SEMICONDUCTOR DEVICE

(71) Applicant: SAMSUNG ELECTRONICS CO., LTD., Suwon-si (KR)

(72) Inventors: Jinseo Choi, Suwon-si (KR); Sohyang Lee, Suwon-si (KR); Jeongmin Jin, Suwon-si (KR); Sohee Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 305 days.

(21) Appl. No.: 18/229,762

(22) Filed: Aug. 3, 2023

(65) Prior Publication Data

US 2024/0196587 A1      Jun. 13, 2024

(30) Foreign Application Priority Data

Dec. 8, 2022    (KR) ........................ 10-2022-0170817

(51) Int. Cl.
*H10B 12/00*          (2023.01)
(52) U.S. Cl.
CPC ........... *H10B 12/02* (2023.02); *H10B 12/315* (2023.02); *H10B 12/482* (2023.02); *H10B 12/00* (2023.02); *H10B 12/09* (2023.02)
(58) Field of Classification Search
CPC ........ H10B 12/00; H10B 12/02; H10B 12/09; H10B 12/315; H10B 12/482
USPC .......................................................... 365/63
See application file for complete search history.

(56) References Cited

U.S. PATENT DOCUMENTS

| | | | |
|---|---|---|---|
| 10,317,798 B2 | 6/2019 | Park et al. | |
| 10,593,677 B2 | 3/2020 | Chang et al. | |
| 11,226,552 B2 | 1/2022 | Ahn et al. | |
| 2006/0263985 A1* | 11/2006 | Kang ................... | H10D 84/017 |
| | | | 438/275 |
| 2010/0193880 A1* | 8/2010 | Yoshida ............... | H10D 84/014 |
| | | | 257/E27.06 |
| 2015/0111360 A1* | 4/2015 | Kim ..................... | H10B 12/482 |
| | | | 438/381 |
| 2022/0037251 A1 | 2/2022 | Park et al. | |
| 2022/0115383 A1 | 4/2022 | Yoon et al. | |
| 2022/0122986 A1 | 4/2022 | Jang et al. | |

(Continued)

FOREIGN PATENT DOCUMENTS

KR      10-2022-0052413 A      4/2022

*Primary Examiner* — Ly D Pham
(74) *Attorney, Agent, or Firm* — Muir Patent Law, PLLC

(57)          ABSTRACT
A method of fabricating a semiconductor device include providing a substrate including cell and peripheral regions, forming a cell gate structure on the cell region, forming a peripheral gate structure on the peripheral region, forming a bit-line structure on the cell region, forming a preliminary pad layer covering the bit-line structure and the peripheral gate structure, and etching the preliminary pad layer to form a landing pad and a peripheral conductive pad. The etching the preliminary pad layer includes forming a first mask structure on the preliminary pad layer, forming a second mask structure on the first mask structure, forming a first photoresist layer on the second mask structure, and using the first photoresist layer as an etching mask to etch the second mask structure. The first photoresist layer includes a first line opening overlapping the cell region, and peripheral resist patterns overlapping the peripheral region.

20 Claims, 42 Drawing Sheets

(56) References Cited

U.S. PATENT DOCUMENTS

| | | | |
|---|---|---|---|
| 2022/0128905 A1 | 4/2022 | Hong et al. | |
| 2022/0231027 A1* | 7/2022 | Seong | H10B 12/0335 |
| 2023/0337417 A1* | 10/2023 | Tseng | H10B 12/09 |

* cited by examiner

FIG. 16A

METHOD OF FABRICATING SEMICONDUCTOR DEVICE

CROSS-REFERENCE TO RELATED APPLICATION

This U.S. nonprovisional application claims priority under 35 U.S.C. § 119 to Korean Patent Application No. 10-2022-0170817, filed on Dec. 8, 2022, in the Korean Intellectual Property Office, the disclosure of which is hereby incorporated by reference in its entirety.

BACKGROUND

1. Field

Embodiments relate to a method of fabricating a semiconductor device, and more particularly, to a method of fabricating a semiconductor device, which method includes forming a landing pad.

2. Description of the Related Art

A semiconductor device attracts attention as an essential element in the electronic industry because of its properties, e.g., compactness, multi-functionality, and/or low manufacturing cost. Semiconductor devices may encompass, e.g., semiconductor memory devices storing logic data, semiconductor logic devices processing operations of logic data, and hybrid semiconductor devices having both memory and logic elements.

Recently, high speed and low consumption electronic products require that semiconductor devices embedded in the electronic products have high operating speed and/or lower operating voltage. However, an increase in integration of semiconductor devices may cause a reduction in electrical properties and production yield of the semiconductor devices. Therefore, many studies have been conducted to increase electrical properties and production yield of semiconductor devices.

SUMMARY

According to some embodiments, a method of fabricating a semiconductor device may include providing a substrate including a cell region and a peripheral region that surrounds the cell region; forming a cell gate structure on the cell region; forming a peripheral gate structure on the peripheral region; forming a bit-line structure on the cell region; forming a preliminary pad layer that covers the bit-line structure and the peripheral gate structure; and etching the preliminary pad layer to form a landing pad and a peripheral conductive pad. The step of etching the preliminary pad layer may include forming a first mask structure on the preliminary pad layer; forming a second mask structure on the first mask structure; forming a first photoresist layer on the second mask structure; and using the first photoresist layer as an etching mask to etch the second mask structure. The first photoresist layer may include: a first line opening that overlaps the cell region; and a plurality of peripheral resist patterns that overlap the peripheral region.

According to some embodiments, a method of fabricating a semiconductor device may include providing a substrate including a cell region and a peripheral region that surrounds the cell region; forming a cell gate structure on the cell region of the substrate; forming a peripheral gate structure on the peripheral region of the substrate; forming a bit-line structure on the cell region of the substrate; forming a preliminary pad layer that covers the bit-line structure and the peripheral gate structure; and etching the preliminary pad layer. The step of etching the preliminary pad layer may include forming a first mask structure on the preliminary pad layer; simultaneously forming on the first mask structure a line mask pattern that overlaps the cell region and a peripheral mask pattern that overlaps the peripheral region; and etching the line mask pattern to form a plurality of cell mask patterns.

According to some embodiments, a method of fabricating a semiconductor device may include providing a substrate including a cell region and a peripheral region that surrounds the cell region; forming a cell gate structure on the cell region; forming a peripheral gate structure on the peripheral region; forming a bit-line structure on the cell region; forming a preliminary pad layer that covers the bit-line structure and the peripheral gate structure; and etching the preliminary pad layer to form a landing pad and a peripheral conductive pad. The step of etching the preliminary pad layer may include: forming a first mask structure on the preliminary pad layer; forming a second mask structure on the first mask structure; forming a first photoresist layer on the second mask structure; using the first photoresist layer as an etching mask to etch the second mask structure; forming a line mask pattern and a peripheral mask pattern on the first mask structure; forming a third mask structure on the line mask pattern and the peripheral mask pattern; forming a second photoresist layer on the third mask structure; using the second photoresist layer as an etching mask to etch the third mask structure; etching the line mask pattern to form a cell mask pattern; using the cell mask pattern and the peripheral mask pattern as an etching mask to etch the first mask structure; and using the etched first mask structure as an etching mask to etch the preliminary pad layer. The first photoresist layer may include: a first line opening that overlaps the cell region; and a peripheral resist pattern that overlaps the peripheral region. The second photoresist layer may include a second line opening that overlaps the cell region. An extending direction of the first line opening and an extending direction of the second line opening may be crossing each other.

BRIEF DESCRIPTION OF THE DRAWINGS

Features will become apparent to those of skill in the art by describing in detail exemplary embodiments with reference to the attached drawings, in which:

FIGS. 2A, 2B, 3A, 3B, 3C, 4A, 4B, 5A, 5B, 6A, 6B, 7A, 7B, 8A, 8B, 9A, 9B, 10A, 10B, 11A, 11B, 11C, 12A, 12B, 12C, 13A, 13B, 14A, 14B, 15A, 15B, 16A, 16B, 16C, 17A, 17B, 18A, and 18B illustrate cross-sectional views showing stages in a method of fabricating a semiconductor device according to some embodiments.

DETAILED DESCRIPTION

The following will describe a semiconductor device and a method of fabricating the same according to some embodiments in conjunction with the accompanying drawings.

Figure 1A:
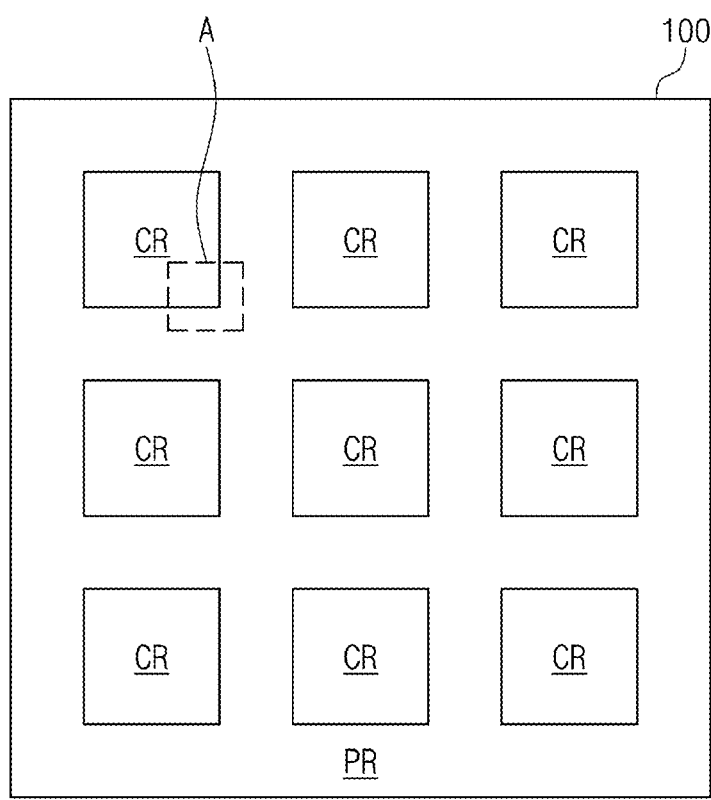
FIG. 1A illustrates a plan view showing a semiconductor device according to some embodiments.
Figure 1A:
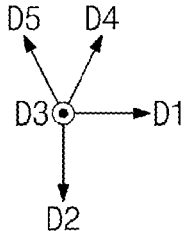
Figure 1B:
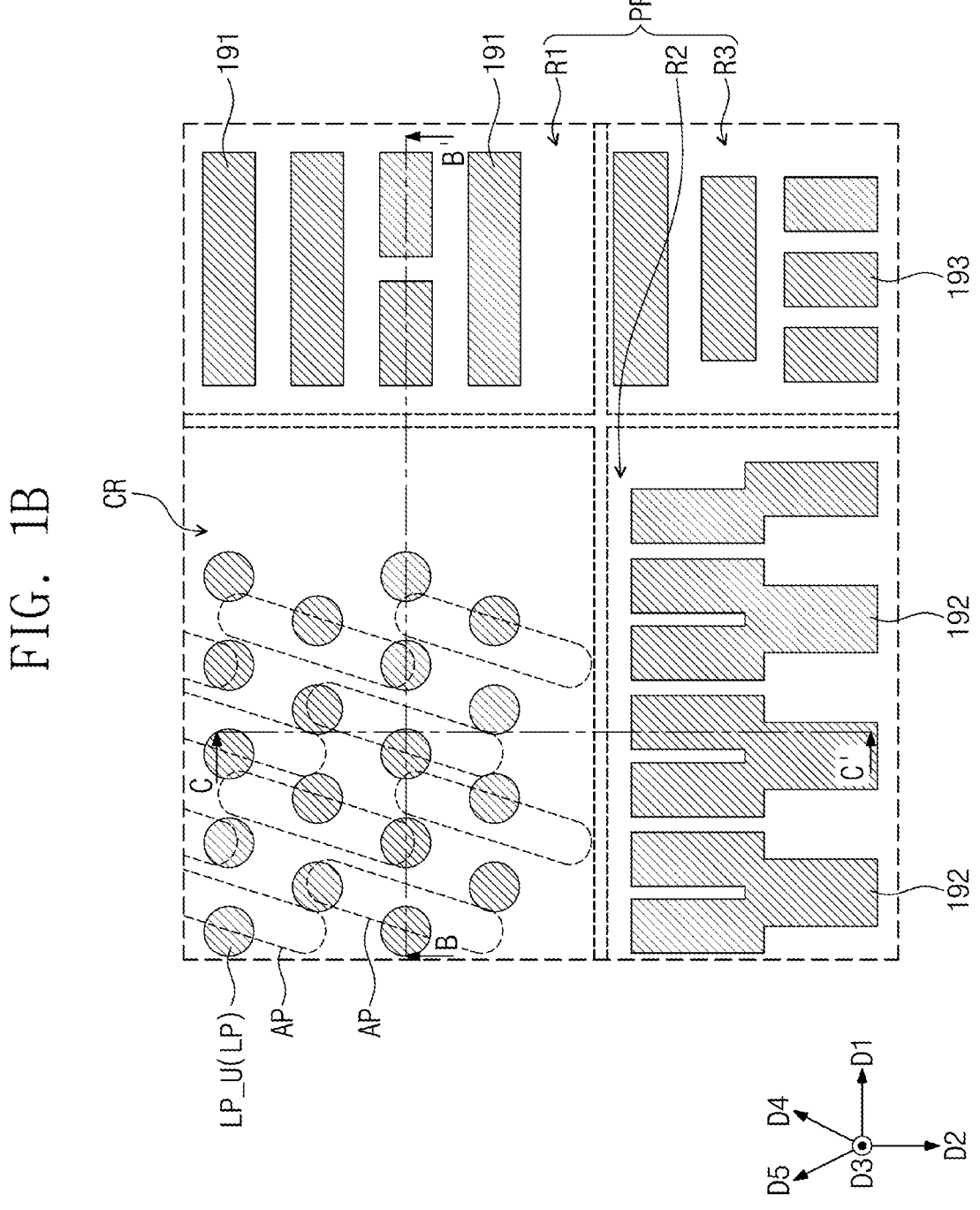
FIG. 1B illustrates an enlarged view showing section A of FIG. 1A.
Figure 1C:
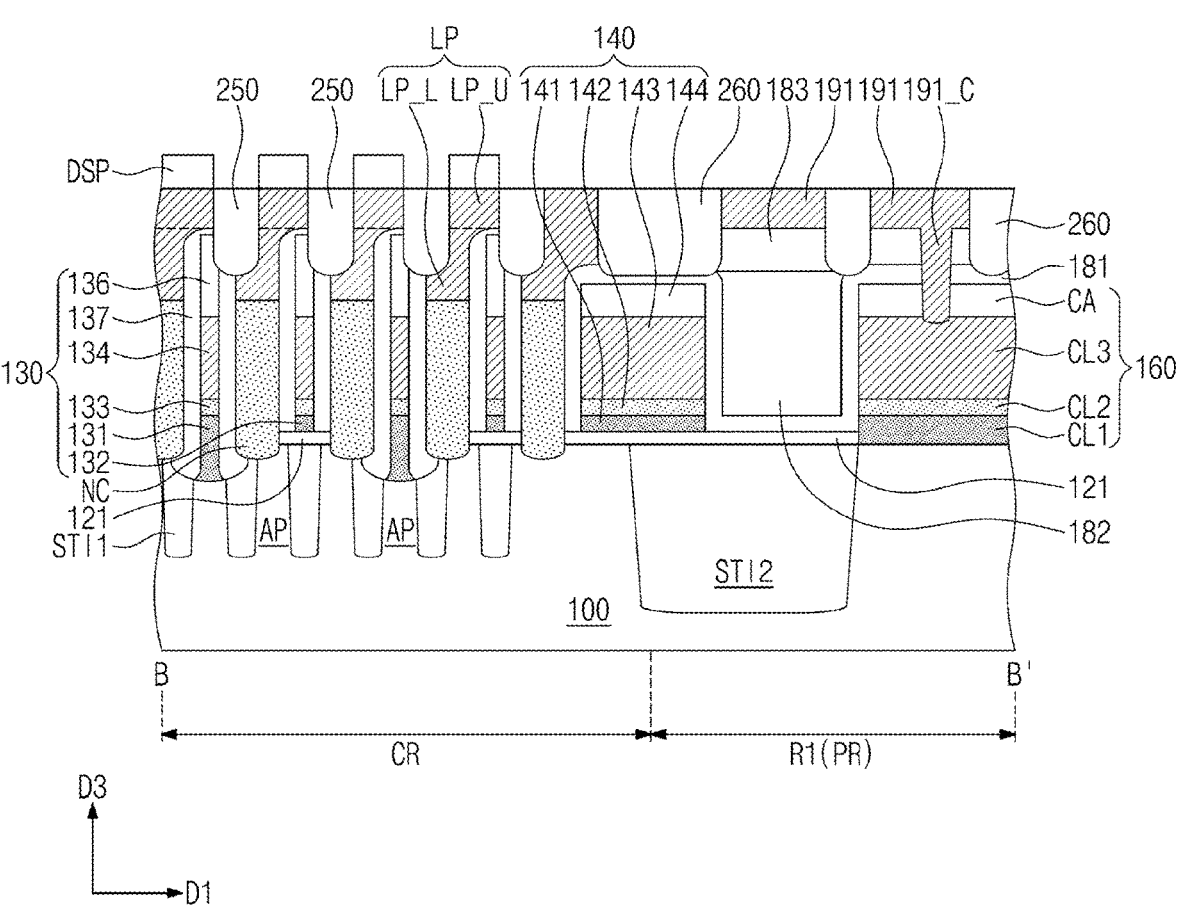
FIG. 1C illustrates a cross-sectional view taken along line B-B' of FIG. 1B.
Figure 1D:
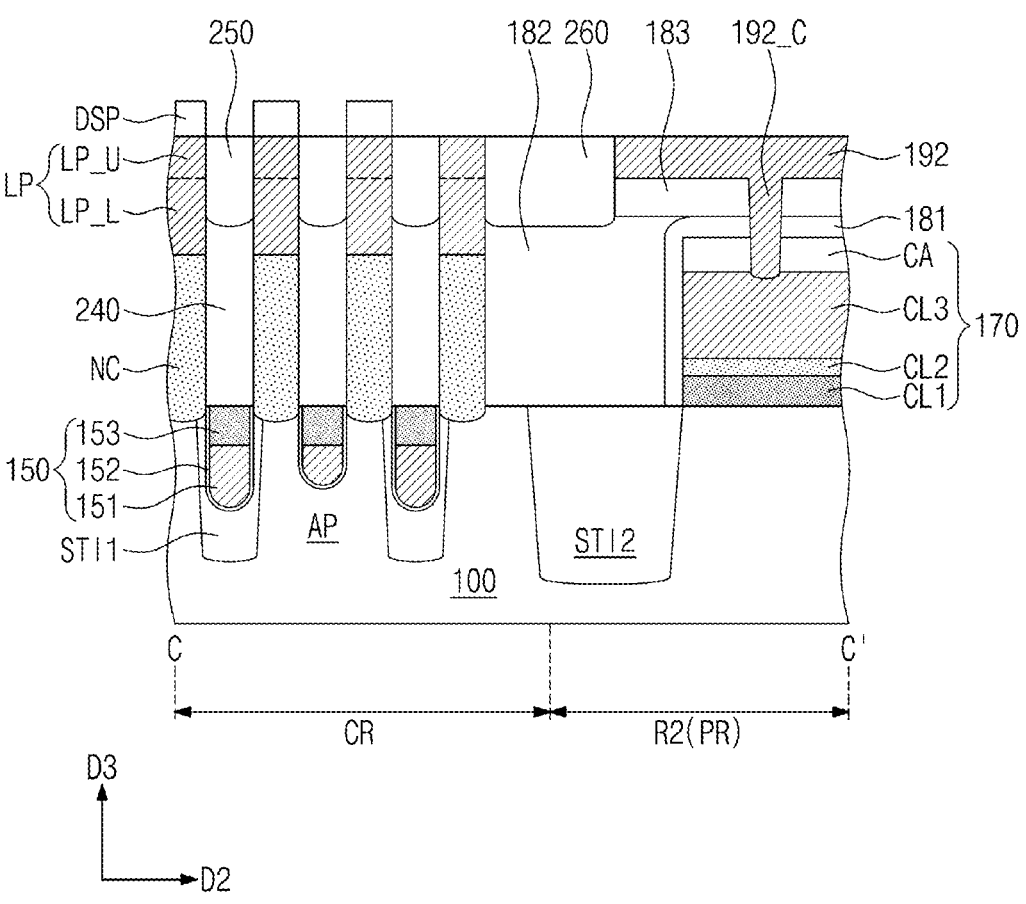
FIG. 1D illustrates a cross-sectional view taken along line C-C' of FIG. 1B.

FIG. 1A illustrates a plan view showing a semiconductor device according to some embodiments. FIG. 1B illustrates an enlarged view of section A of FIG. 1A. FIG. 1C illustrates a cross-sectional view taken along line B-B' of FIG. 1B. FIG. 1D illustrates a cross-sectional view taken along line C-C' of FIG. 1B.

Referring to FIGS. 1A, 1B, 1C, and 1D, a semiconductor device may include a substrate 100. In some embodiments, the substrate 100 may be a semiconductor substrate. For example, the substrate 100 may include silicon (Si), germanium (Ge), silicon-germanium (SiGe), gallium phosphide (GaP), or gallium arsenide (GaAs). In some embodiments, the substrate 100 may be a silicon-on-insulator (SOI) substrate or a germanium-on-insulator (GOI) substrate. The substrate 100 may have a plate shape that extends along a plane elongated in a first direction D1 and a second direction D2. The first direction D1 and the second direction D2 may intersect each other. For example, the first direction D1 and the second direction D2 may be horizontal directions that are orthogonal to each other and parallel to a top surface of the substrate 100.

The substrate 100 may include cell regions CR and a peripheral region PR that surrounds the cell regions CR. The peripheral region PR may include first regions R1, second regions R2, and third regions R3. The first region R1 may be disposed between the cell regions CR that are arranged in the first direction D1. The second region R2 may be disposed between the cell regions CR that are arranged in the second direction D2. The third region R3 may be disposed between the first regions R1 that are adjacent to each other and between the second regions R2 that are adjacent to each other.

The cell region CR of the substrate 100 may include active patterns AP. The active patterns AP may be defined to indicate upper portions of the cell region CR of the substrate 100, and the upper portions of the cell region CR may protrude in a third direction D3. The third direction D3 may intersect the first direction D1 and the second direction D2. For example, the third direction D3 may be a vertical direction perpendicular to the first direction D1 and the second direction D2. The active patterns AP may be spaced apart from each other.

A first device isolation layer STI1 may be provided to define the active patterns AP. The first device isolation layer STI1 may be provided in the cell region CR of the substrate 100. Each of the active patterns AP may be surrounded by the first device isolation layer STI1.

A second device isolation layer STI2 may be provided in the substrate 100. The second device isolation layer STI2 may be provided between the cell region CR and the peripheral region PR. In some embodiments, the second device isolation layer STI2 and the first device isolation layer STI1 may be connected to have a single unitary structure with no boundary therebetween.

The first and second device isolation layers STI1 and STI2 may include a dielectric material. For example, the first and second device isolation layers STI1 and STI2 may include at least one of an oxide and a nitride.

There may be provided cell gate structures 150 that extend, e.g., lengthwise, in the first direction D1. The cell gate structures 150 may be arranged, e.g., spaced apart, in the second direction D2. The cell gate structure 150 may be provided on the cell region CR of the substrate 100. The cell gate structure 150 may be provided on the first device isolation layer STI1 and the active patterns AP. The cell gate structure 150 may be a buried gate structure that is buried in the active patterns AP and the first device isolation layer STI1. The active patterns AP may include impurity regions. The cell gate structure 150 and the active pattern AP may define a cell transistor.

The cell gate structure 150 may include a gate dielectric layer 152 on the active pattern AP, a gate electrode 151 on the gate dielectric layer 152, and a gate capping layer 153 on the gate electrode 151. The gate dielectric layer 152 and the gate capping layer 153 may include a dielectric material. For example, the gate dielectric layer 152 may include oxide, and the gate capping layer 153 may include nitride. The gate electrode 151 may include a conductive material.

The active pattern AP may include one first part and two second parts. The first part of the active pattern AP may be disposed between the two second parts of the active pattern AP. The cell gate structure 150 may be provided between the first part and the second part of the active pattern AP. The first and second parts of the active pattern AP may be spaced apart from each other across the cell gate structure 150.

Dielectric patterns 121 may be provided on the cell gate structure 150, the first device isolation layer STI1, and the second device isolation layer STI2. The dielectric pattern 121 may include a dielectric material. In some embodiments, the dielectric pattern 121 may include a plurality of dielectric layers.

There may be provided bit-line structures 130 that extend, e.g., lengthwise, in the second direction D2. The bit-line structures 130 may be arranged, e.g., spaced apart, in the first direction D1. The bit-line structure 130 may be provided on the cell region CR of the substrate 100. The bit-line structure 130 may be provided on the dielectric pattern 121 and the active pattern AP. The bit-line structure 130 may be electrically connected to the active pattern AP.

Each of the bit-line structures 130 may include bit-line contacts 131, first conductive layers 132, a second conductive layer 133, a third conductive layer 134, a bit-line capping layer 136, and a bit-line spacer 137.

The bit-line contacts 131 of the bit-line structure 130 may be arranged, e.g., spaced apart, in the second direction D2. The first conductive layers 132 of the bit-line structure 130 may be arranged, e.g., spaced apart, in the second direction D2. The bit-line contacts 131 and the first conductive layers 132 of the, e.g., same, bit-line structure 130 may be disposed alternately with each other along the second direction D2. The bit-line contact 131 may be disposed on the first part of the active pattern AP. The bit-line contact 131 may penetrate the dielectric pattern 121. The first conductive layer 132 may be provided on the dielectric pattern 121, e.g., without penetrating the dielectric pattern 121. The bit-line contact 131 and the first conductive layer 132 may include a conductive material. For example, the bit-line contact 131 and the first conductive layer 132 may include polysilicon. In some embodiments, the bit-line contacts 131 and the first conductive layers 132 included in one bit-line structure 130 may be connected to have a single unitary structure with no boundary therebetween.

The second conductive layer 133 may be provided on the bit-line contacts 131 and the first conductive layers 132. The third conductive layer 134 may be provided on the second conductive layer 133. The bit-line capping layer 136 may be provided on the third conductive layer 134. The second conductive layer 133 and the third conductive layer 134 may include a conductive material. For example, the second conductive layer 133 may include polysilicon, and the third conductive layer 134 may include metal. The bit-line capping layer 136 may include a dielectric material. In some embodiments, the number of conductive layers included in one bit-line structure 130 may be greater or less than that shown.

The bit-line spacer 137 may cover a top surface and a sidewall of the bit-line capping layer 136, sidewalls of the first, second, and third conductive layers 132, 133, and 134, and sidewalls of the bit-line contacts 131. The bit-line spacer 137 may include a dielectric material. In some embodiments, the bit-line spacer 137 may include a plurality of dielectric layers.

Node contacts NC may be provided. The node contact NC may be provided on the cell region CR of the substrate 100. The node contact NC may be provided on the second part of the active pattern AP. The node contact NC may be provided between the bit-line structures 130 that are adjacent to each other. The node contact NC may be provided on a sidewall of the bit-line structure 130. The node contact NC may include a conductive material. For example, the node contact NC may include polysilicon.

Landing pads LP may be provided. The landing pad LP may be provided on the node contact NC. The landing pad LP may include a conductive material. For example, the landing pad LP may include metal. In some embodiments, a metal silicide layer may be provided between the node contact NC and the landing pad LP. In some embodiments, a barrier layer may be provided between the node contact NC and the landing pad LP.

The landing pad LP may include an upper part LP_U and a lower part LP_L. The upper part LP_U of the landing pad LP may be a portion located at a higher level than that of the bit-line structure 130, e.g., the upper part LP_U of the landing pad LP may be entirely above an uppermost surface of the bit-line structure 130. The lower part LP_L of the landing pad LP may be a portion connected to, e.g., directly contacting, the node contact NC. The upper part LP_U of the landing pad LP may be provided on the lower part LP_L of the landing pad LP, e.g., the lower part LP_L may be between the upper part LP_U and the node contact NC. A portion of the upper part LP_U of the landing pad LP may overlap in the third direction D3 with a portion of the node contact NC, e.g., a portion of the upper part LP_U of the landing pad LP may overlap in the third direction D3 an upper surface of the node contact NC. In some embodiments, an entirety of the landing pad LP may be located at a higher level than that of the bit-line structure 130, e.g., relative to a bottom of the substrate 100.

Dielectric fences 240 may be provided. The dielectric fence 240 may be provided on the gate capping layer 153 of the cell gate structure 150. The dielectric fence 240 may be provided between the node contacts NC that are adjacent to each other in the second direction D2. The dielectric fence 240 may be provided between the bit-line structures 130 that are adjacent to each other in the first direction D1. The dielectric fence 240 may include a dielectric material.

A first separation structure 250 may be provided on the dielectric fence 240. The first separation structure 250 may separate the landing pads LP from each other. The first separation structure 250 may surround the landing pad LP. The first separation structure 250 may include a dielectric material.

Data storage patterns DSP may be provided. The data storage pattern DSP may be electrically connected to the active pattern AP through the landing pad LP and the node contact NC. In some embodiments, each of the data storage patterns DSP may be a capacitor including a bottom electrode, a dielectric layer, and a top electrode. In this case, the semiconductor device including the data storage patterns DSP may be a dynamic random access memory (DRAM). In some embodiments, each of the data storage patterns DSP may include a magnetic tunnel junction pattern. In this case, the semiconductor device including the data storage patterns DSP may be a magnetic random access memory (MRAM). In some embodiments, the data storage patterns DSP may include a phase change material or a variable resistance material. In this case, the semiconductor device including the data storage patterns DSP may be a phase change random access memory (PRAM) or a resistive random access memory (ReRAM). In some embodiments, each of the data storage patterns DSP may include various materials and/or structures capable of storage data.

A dummy line structure 140 may be provided. The dummy line structure 140 may extend, e.g., lengthwise, in the second direction D2. The dummy line structure 140 may be disposed between the bit-line structure 130 and the first region R1. The dummy line structure 140 may be disposed adjacent to the first region R1.

The dummy line structure 140 may include a first dummy conductive layer 141 on the dielectric pattern 121, a second dummy conductive layer 142 on the first dummy conductive layer 141, a third dummy conductive layer 143 on the second dummy conductive layer 142, and a dummy capping layer 144 on the third dummy conductive layer 143. The first, second, and third dummy conductive layers 141, 142, and 143 may include a conductive material. For example, the first and second dummy conductive layers 141 and 142 may include polysilicon, and the third dummy conductive layer 143 may include metal. The dummy capping layer 144 may include a dielectric material.

First peripheral gate structures 160 may be provided. The first peripheral gate structure 160 may be provided on the first region R1 of the substrate 100. In some embodiments, the first peripheral gate structure 160 may be a gate of a transistor that constitutes a sub-word line driver.

Second peripheral gate structures 170 may be provided. The second peripheral gate structure 170 may be provided on the second region R2 of the substrate 100. In some embodiments, the second peripheral gate structure 170 may be a gate of a transistor that constitutes a sense amplifier.

Each of the first and second peripheral gate structures 160 and 170 may include a first peripheral conductive layer CL1, a second peripheral conductive layer CL2 on the first peripheral conductive layer CL1, a third peripheral conductive layer CL3 on the second peripheral conductive layer CL2, and a peripheral capping layer CA on the third peripheral conductive layer CL3. The first, second, and third peripheral conductive layers CL1, CL2, and CL3 may include a conductive material. For example, the first and second peripheral conductive layers CL1 and CL2 may include polysilicon, and the third peripheral conductive layer CL3 may include metal. The peripheral capping layer CA may include a dielectric material.

A peripheral spacer 181 may be provided to cover the dummy line structure 140, the first peripheral gate structure 160, and the second peripheral gate structure 170. The peripheral spacer 181 may include a dielectric material.

A first filling dielectric layer 182 may be provided on the peripheral spacer 181. The first filling dielectric layer 182 may include a portion provided between the dummy line structure 140 and the first peripheral gate structure 160, and may also include a portion provided between the node contact NC and the second peripheral gate structure 170. The first filling dielectric layer 182 may include a dielectric material.

A second filling dielectric layer 183 may be provided on the first filling dielectric layer 182 and the peripheral spacer 181. The second filling dielectric layer 183 may include a dielectric material.

The second filling dielectric layer 183 may be provided thereon with first peripheral conductive pads 191, second peripheral conductive pads 192, and third peripheral conductive pads 193. The first peripheral conductive pads 191 may overlap in the third direction D3 with the first region R1 of the substrate 100. The second peripheral conductive pads 192 may overlap in the third direction D3 with the second region R2 of the substrate 100. The third peripheral conductive pads 193 may overlap in the third direction D3 with the third region R3 of the substrate 100. The first, second, and third peripheral conductive pads 191, 192, and 193 may include a conductive material.

At least one of the first peripheral conductive pads 191 may include a first contact 191_C, and may be electrically connected through the first contact 191_C to the first peripheral gate structure 160. In some embodiments, at least one of the first peripheral conductive pads 191 may be electrically connected to a source or a drain of a transistor that constitutes a sub-word line driver.

At least one of the second peripheral conductive pads 192 may include a second contact 192_C, and may be electrically connected through the second contact 192_C to the second peripheral gate structure 170. In some embodiments, at least one of the second peripheral conductive pads 192 may be electrically connected to a source or a drain of a transistor that constitutes a sense amplifier.

In some embodiments, at least one of the third peripheral conductive pads 193 may be electrically connected to a transistor provided on the third region R3 of the substrate 100.

A second separation structure 260 may be provided on the peripheral spacer 181, the first filling dielectric layer 182, and the second filling dielectric layer 183. The second separation structure 260 may separate the first peripheral conductive pads 191 from each other. The second separation structure 260 may separate the second peripheral conductive pads 192 from each other. The second separation structure 260 may separate the third peripheral conductive pads 193 from each other. A portion of the second separation structure 260 may be provided between the first peripheral conductive pad 191 and the landing pad LP. A portion of the second separation structure 260 may be provided between the second peripheral conductive pad 192 and the landing pad LP. The second separation structure 260 may include a dielectric material. In some embodiments, the first separation structure 250 and the second separation structure 260 may be connected to have a single unitary structure with no boundary therebetween.

FIGS. 2A, 2B, 3A, 3B, 3C, 4A, 4B, 5A, 5B, 6A, 6B, 7A, 7B, 8A, 8B, 9A, 9B, 10A, 10B, 11A, 11B, 11C, 12A, 12B, 12C, 13A, 13B, 14A, 14B, 15A, 15B, 16A, 16B, 16C, 17A, 17B, 18A, and 18B illustrate cross-sectional views showing stages in a method of fabricating a semiconductor device according to some embodiments. FIGS. 3A, 11A, 12A, and 16A correspond to FIG. 1B. FIGS. 2A, 3B, 4A, 5A, 6A, 7A, 8A, 9A, 10A, 11B, 12B, 13A, 14A, 15A, 16B, 17A, and 18A correspond to FIG. 1C. FIGS. 2B, 3C, 4B, 5B, 6B, 7B, 8B, 9B, 10B, 11C, 12C, 13B, 14B, 15B, 16C, 17B, and 18B correspond to FIG. 1D.

Figure 2A:
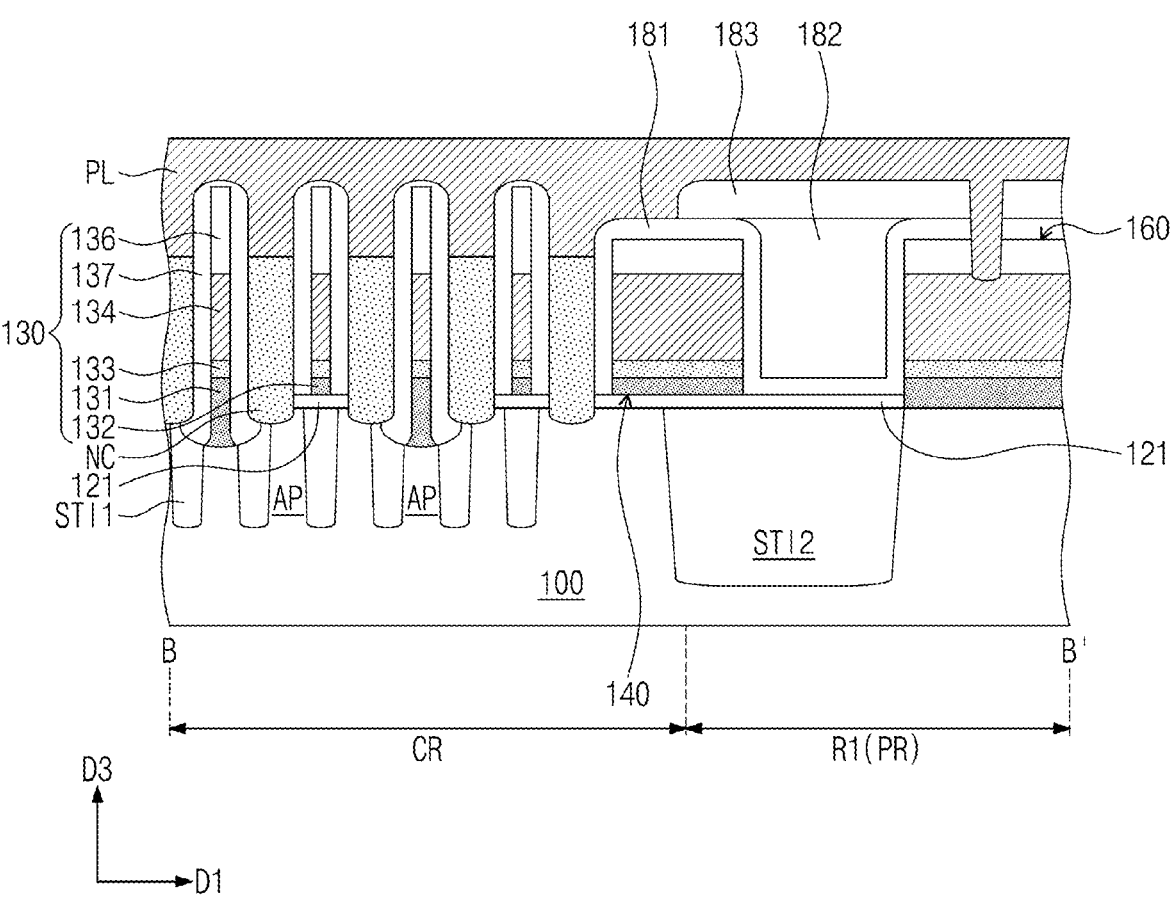
Figure 2B:
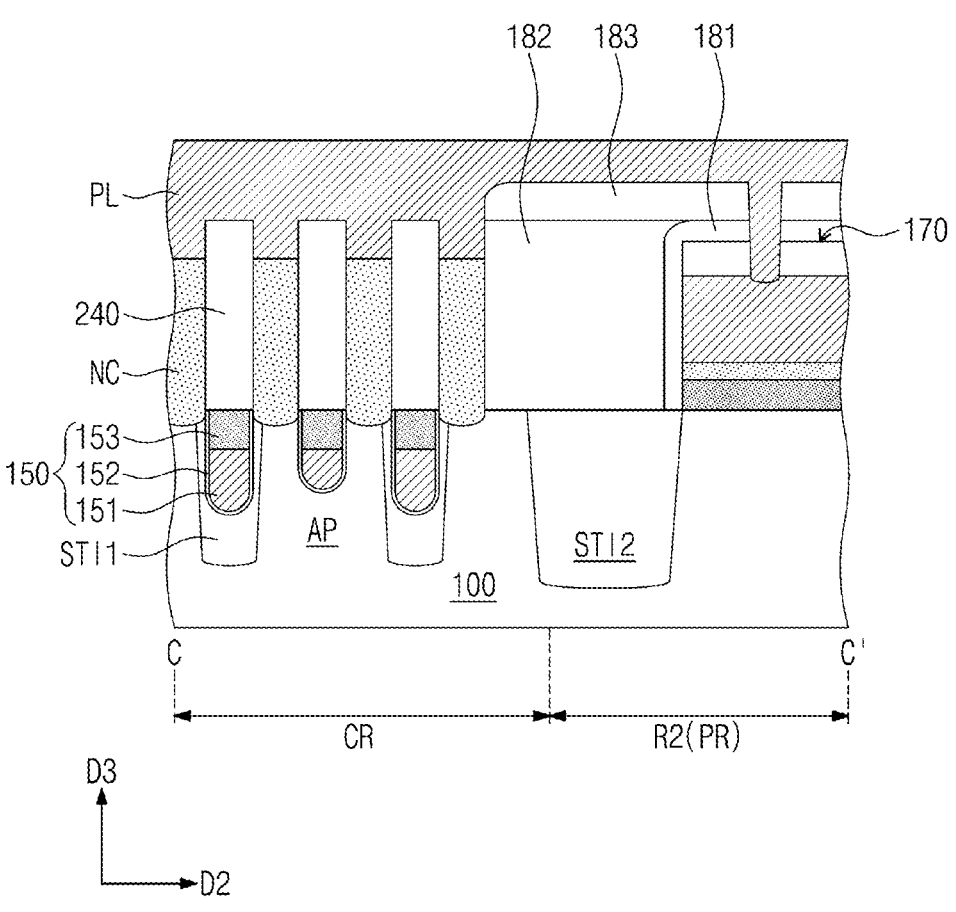

Referring to FIGS. 2A and 2B, the substrate 100 may be provided to include the cell region CR and the peripheral region PR. The first and second device isolation layers STI1 and STI2 may be formed on the substrate 100. The active patterns AP of the substrate 100 may be formed. The cell gate structures 150 may be formed on the cell region CR of the substrate 100. The dielectric patterns 121 may be formed on the substrate 100. The bit-line structure 130, the dummy line structure 140, the first peripheral gate structure 160, the second peripheral gate structure 170, the peripheral spacer 181, the first filling dielectric layer 182, and the second filling dielectric layer 183 may be formed. The bit-line structure 130 may be formed on the cell region CR of the substrate 100. The first and second peripheral gate structures 160 and 170 may be formed on the peripheral region PR of the substrate 100.

The node contact NC and the dielectric fence 240 may be formed. A preliminary pad layer PL may be formed on the node contact NC, the dielectric fence 240, the bit-line structure 130, and the second filling dielectric layer 183. The preliminary pad layer PL may cover, e.g., entirely and continuously, the bit-line structure 130, the first peripheral gate structure 160, and the second peripheral gate structure 170. The preliminary pad layer PL may include a conductive material.

Figure 3A:
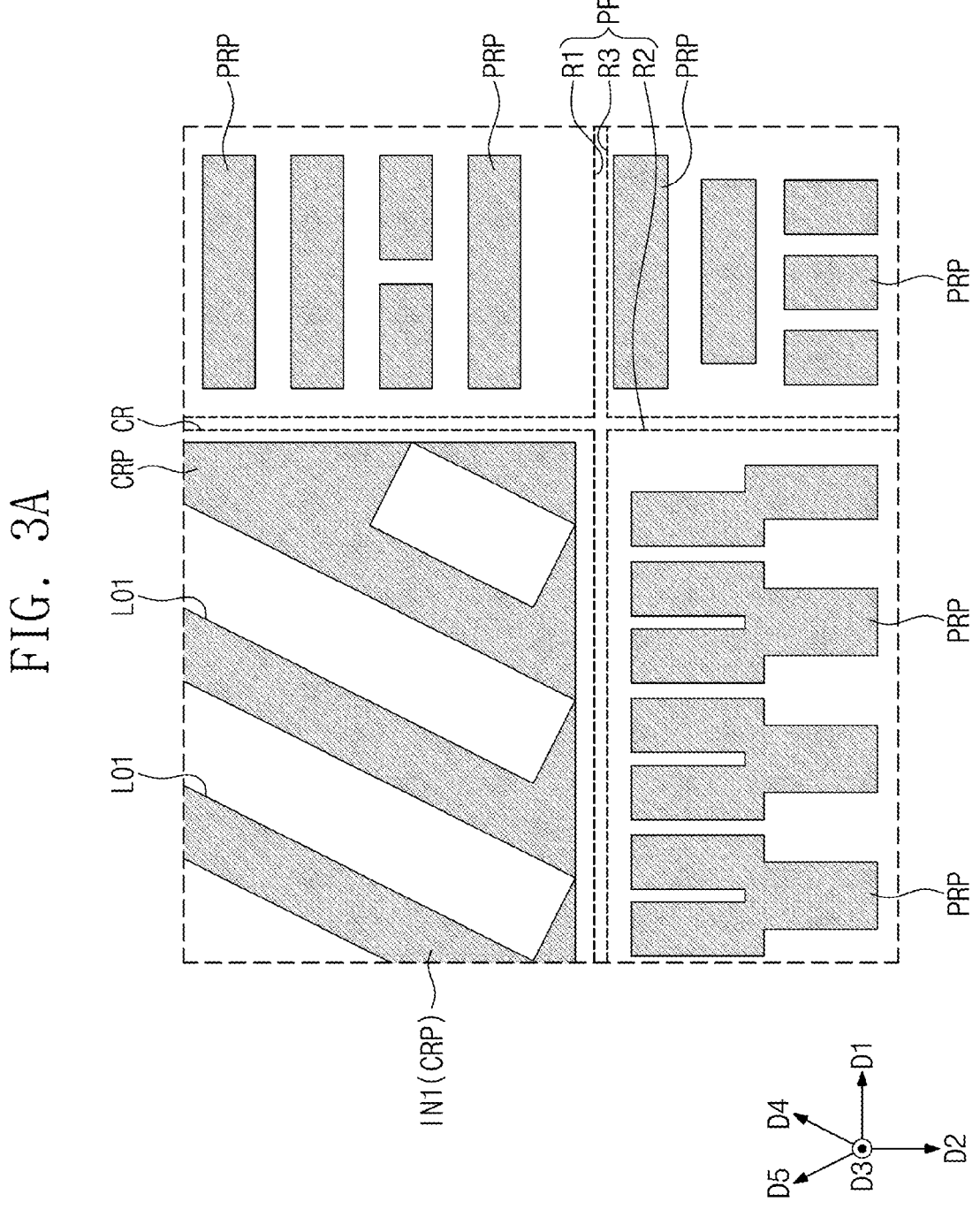
Figure 3B:
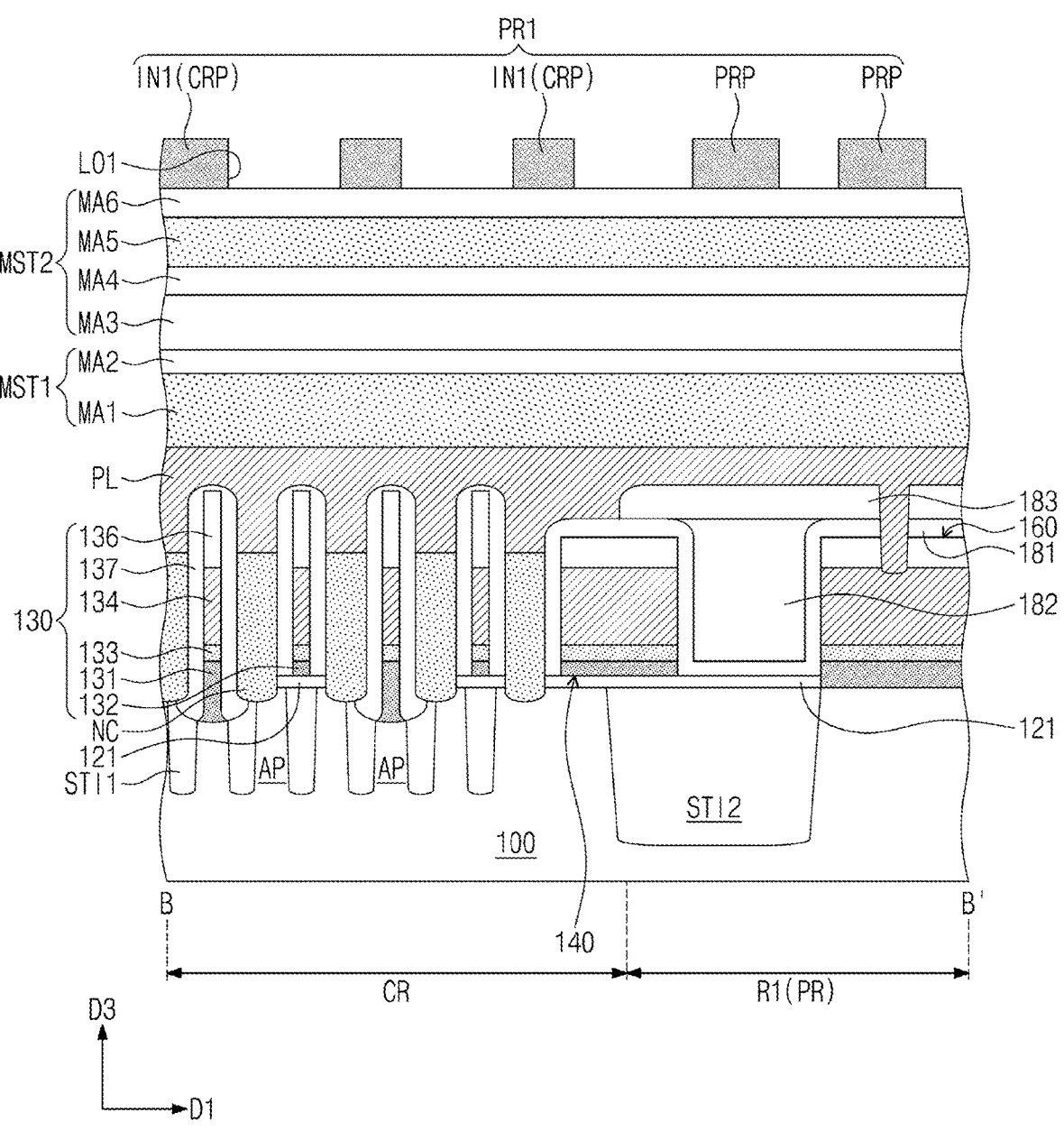
Figure 3C:
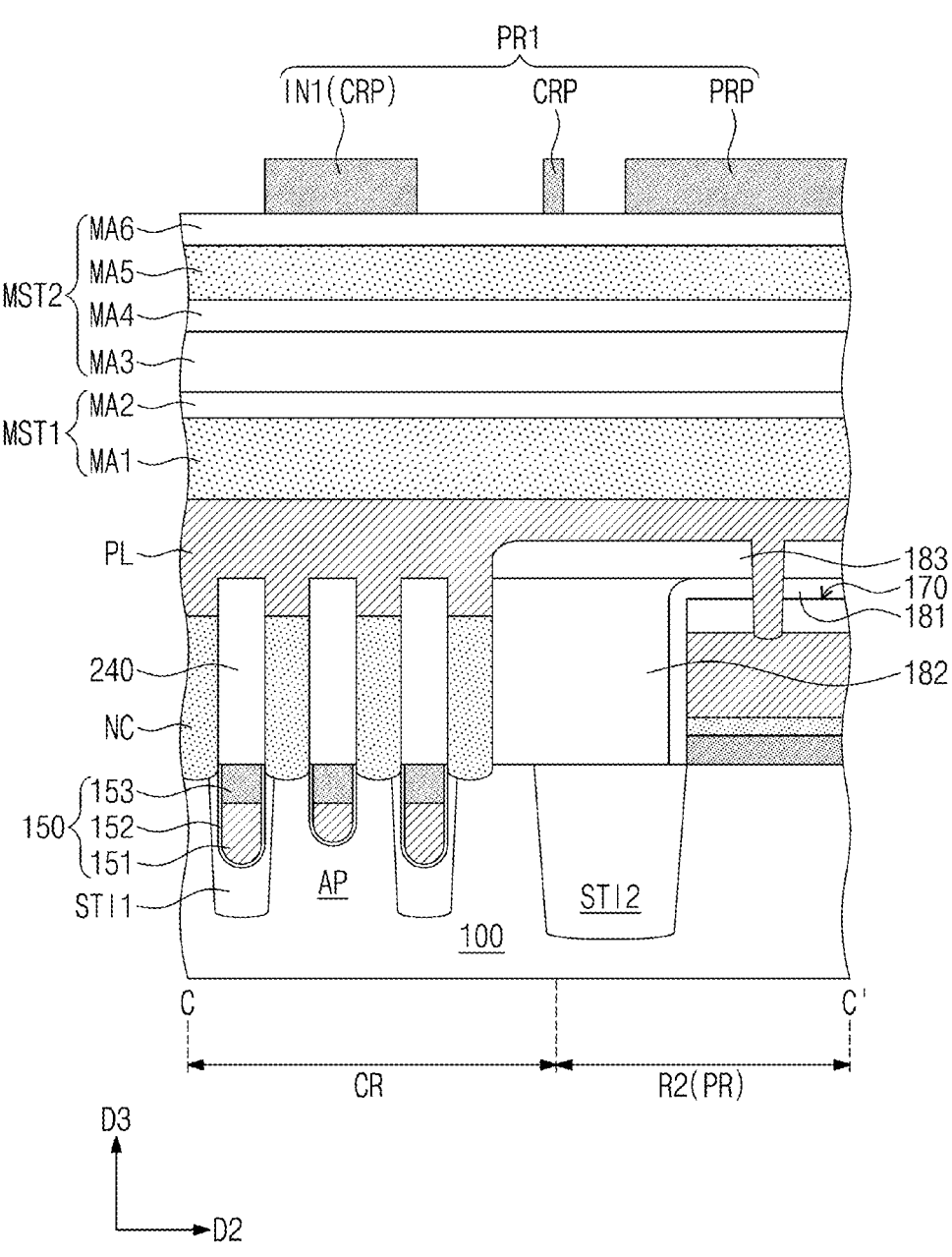

Referring to FIGS. 3A, 3B, and 3C, a first mask structure MST1 may be formed on the peripheral pad layer PL. The first mask structure MST1 may include a first mask layer MA1 on the preliminary pad layer PL and a second mask layer MA2 on the first mask layer MA1.

The first mask layer MA1 may include, e.g., an amorphous carbon layer (ACL). The second mask layer MA2 may include a material having an etch selectivity with respect to the first mask layer MA1. For example, the second mask layer MA2 may include silicon (Si) or silicon oxynitride (SiON). In detail, the second mask layer MA2 may include monocrystalline silicon.

A second mask structure MST2 may be formed on the first mask structure MST1. The second mask structure MST2 may include a third mask layer MA3 on the second mask layer MA2, a fourth mask layer MA4 on the third mask layer MA3, a fifth mask layer MA5 on the fourth mask layer MA4, and a sixth mask layer MA6 on the fifth mask layer MA5.

The third mask layer MA3 may include a material having an etch selectivity with respect to the second mask layer MA2. For example, the third mask layer MA3 may include oxide. The fourth mask layer MA4 may include a material having an etch selectivity with respect to the third mask layer MA3. For example, the fourth mask layer MA4 may include silicon or silicon oxynitride. In detail, the fourth mask layer MA4 may include monocrystalline silicon. The fifth mask layer MA5 may include a material having an etch selectivity with respect to the fourth mask layer MA4. For example, the fifth mask layer MA5 may include a spin-on-hardmask (SOH) layer. The sixth mask layer MA6 may include a material having an etch selectivity with respect to the fifth mask layer MA5. For example, the sixth mask layer MA6 may include silicon oxynitride.

A first photoresist layer PR1 may be formed on the second mask structure MST2. The formation of the first photoresist layer PR1 may include forming a first preliminary photoresist layer, and performing exposure and development processes on the first preliminary photoresist layer. For example, the exposure process of the first preliminary photoresist layer may be an extreme ultraviolet (EUV) exposure process.

The first photoresist layer PR1 may include a cell resist pattern CRP and peripheral resist patterns PRP, e.g., the same first photoresist layer PR1 may include both the cell resist pattern CRP and the peripheral resist patterns PRP. The cell resist pattern CRP may overlap in the third direction D3 with the cell region CR. The peripheral resist patterns PRP may overlap in the third direction D3 with the peripheral region PR. The peripheral resist patterns PRP may include peripheral resist patterns PRP that overlap in the third direction D3 with the first region R1, peripheral resist patterns PRP that overlap in the third direction D3 with the second region R2, and peripheral resist patterns PRP that overlap in the third direction D3 with the third region R3.

The cell resist pattern CRP may include first line openings LO1. The first line openings LO1 may extend in a fourth direction D4. The fourth direction D4 may intersect the first direction D1, the second direction D2, and the third direction D3. For example, the fourth direction D4 may be perpendicular to the third direction D3. For example, as illustrated in FIG. 3A, the fourth direction D4 may be parallel to the top surface of the substrate 100 and extend at an oblique angle (e.g., diagonally) with respect to each of the first and second directions D1 and D2. The first line openings LO1 may be spaced apart from each other, e.g., the first line openings LO1 may be parallel to each other. The first line openings LO1 may overlap in the third direction D3 with the cell region CR.

The cell resist pattern CRP may include a first intervening part IN1 disposed between the first line openings LO1. The first intervening part IN1 of the cell resist pattern CRP may extend in the fourth direction D4. The first intervening part IN1 of the cell resist pattern CRP may have sidewalls that extend in the fourth direction D4. The sixth mask layer MA6 of the second mask structure MST2 may be exposed through the first line opening LO1.

The peripheral resist patterns PRP may be spaced apart from each other. The peripheral resist patterns PRP may be spaced apart from the cell resist pattern CRP. The sixth mask layer MA6 of the second mask structure MST2 may be exposed between the peripheral resist patterns PRP.

Figure 4A:
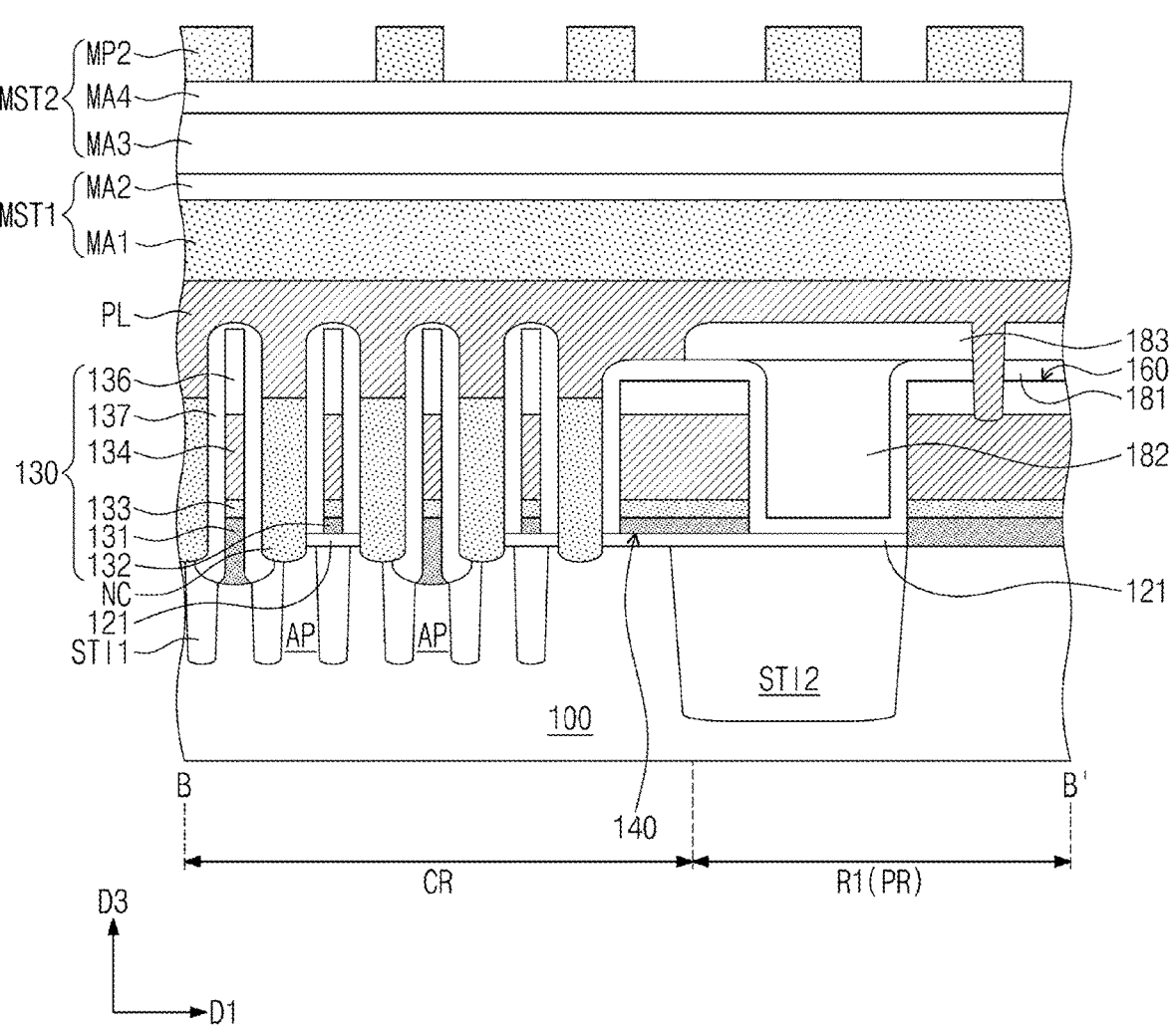
Figure 4B:
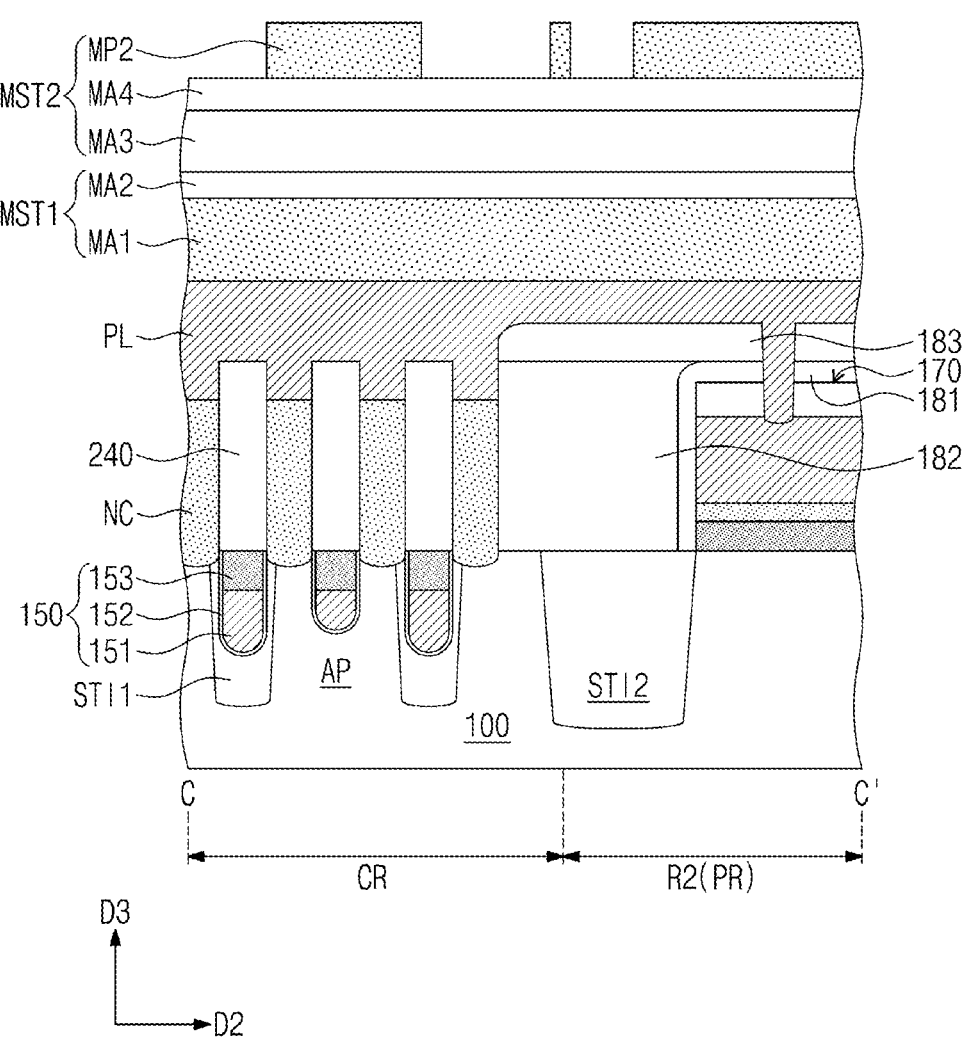

Referring to FIGS. 4A and 4B, the first photoresist layer PR1 may be used as an etching mask to etch the second mask structure MST2. The cell resist pattern CRP and the peripheral resist patterns PRP of the first photoresist layer PR1 may be used as an etching mask to etch the sixth mask layer MA6 of the second mask structure MST2.

The sixth mask layer MA6 may be etched to form first mask patterns. The first mask patterns may be defined to indicate portions of the sixth mask layer MA6 that are not removed by etching. After the formation of the first mask patterns, the first photoresist layer PR1 may be removed.

The first mask patterns may be used as an etching mask to etch the fifth mask layer MA5. The fifth mask layer MA5 may be etched to form second mask patterns MP2 (e.g., which expose portions of the fourth mask layer MA4). The second mask patterns MP2 may be defined to indicate portions of the fifth mask layer MA5 that are removed by etching. After the formation of the second mask patterns MP2, the first mask patterns may be removed.

Figure 5A:
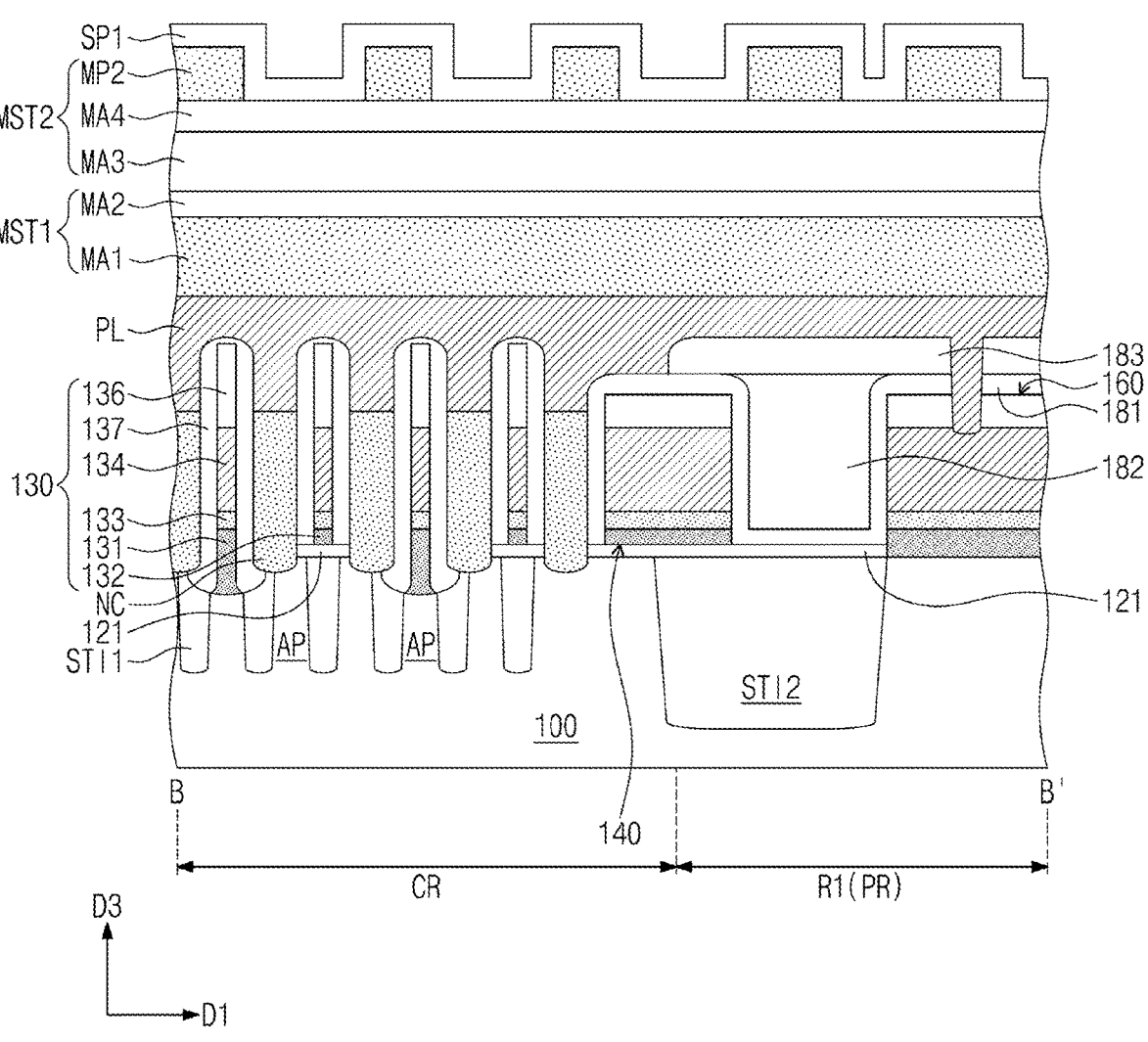
Figure 5B:
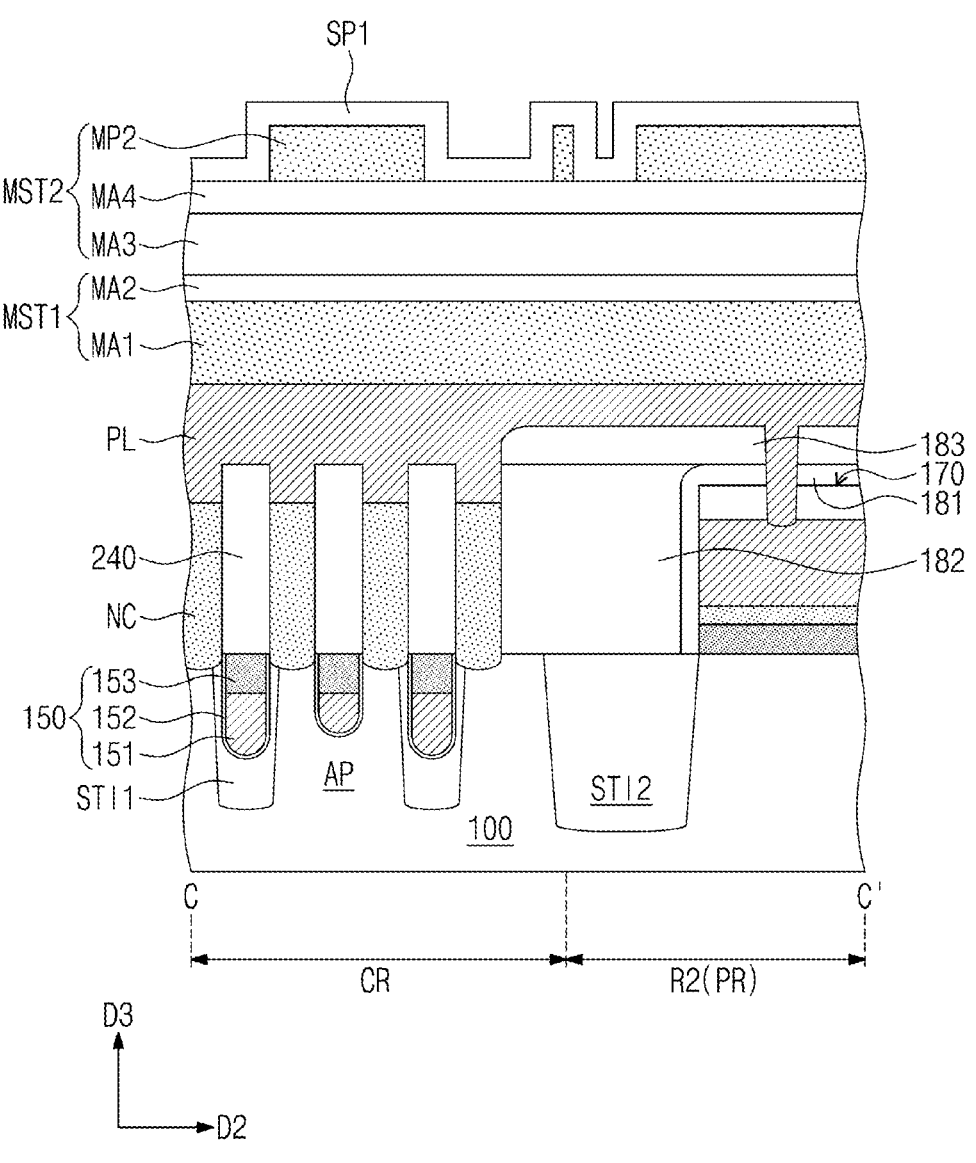

Referring to FIGS. 5A and 5B, a first spacer layer SP1 may be formed which covers the second mask patterns MP2 and the fourth mask layer MA4. For example, an atomic layer deposition (ALD) process may be employed to form the first spacer layer SP1. The first spacer layer SP1 may be conformally formed on the second mask patterns MP2 and the fourth mask layer MA4. The first spacer layer SP1 may include a dielectric material. For example, the first spacer layer SP1 may include oxide.

Figure 6A:
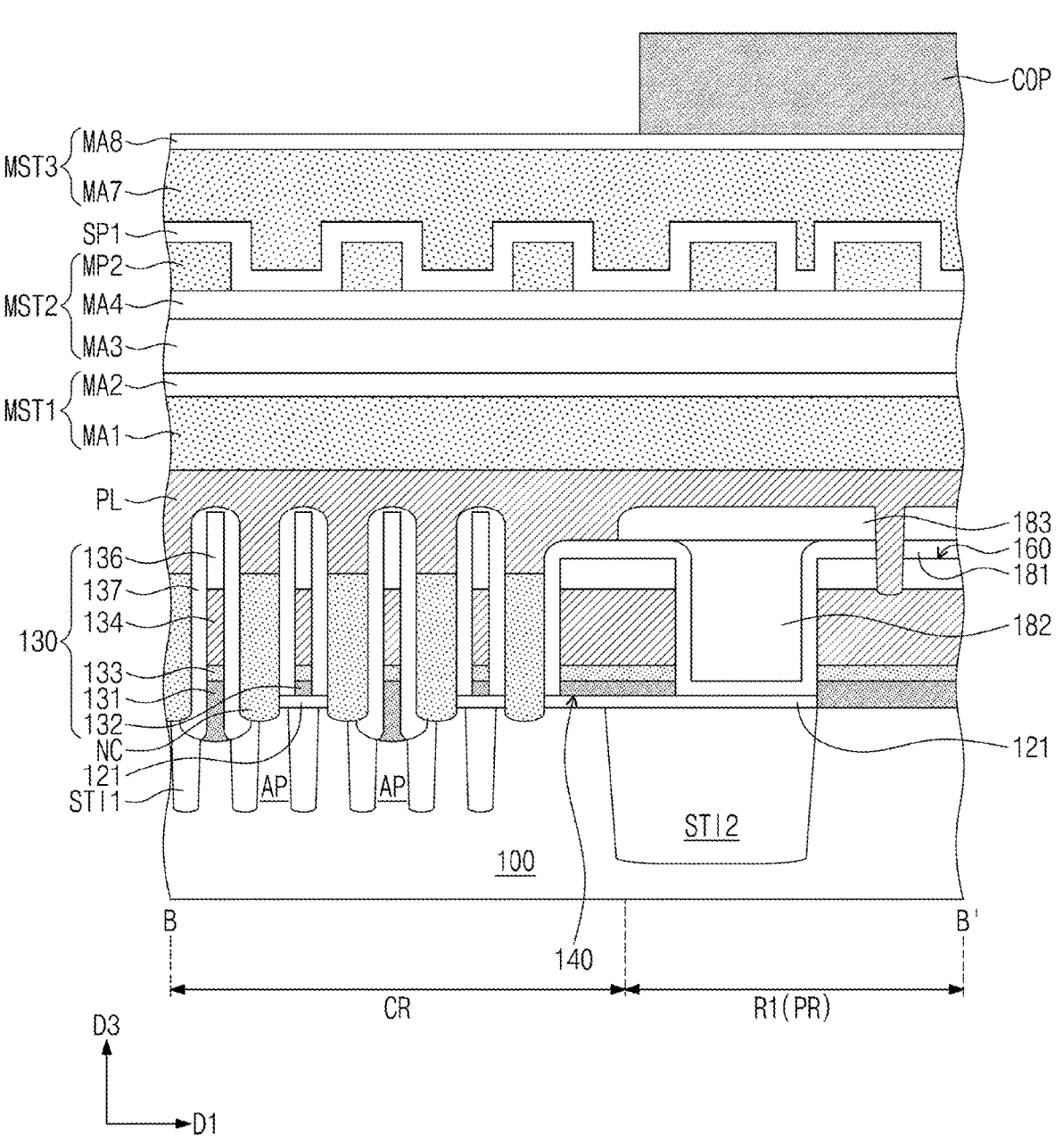
Figure 6B:
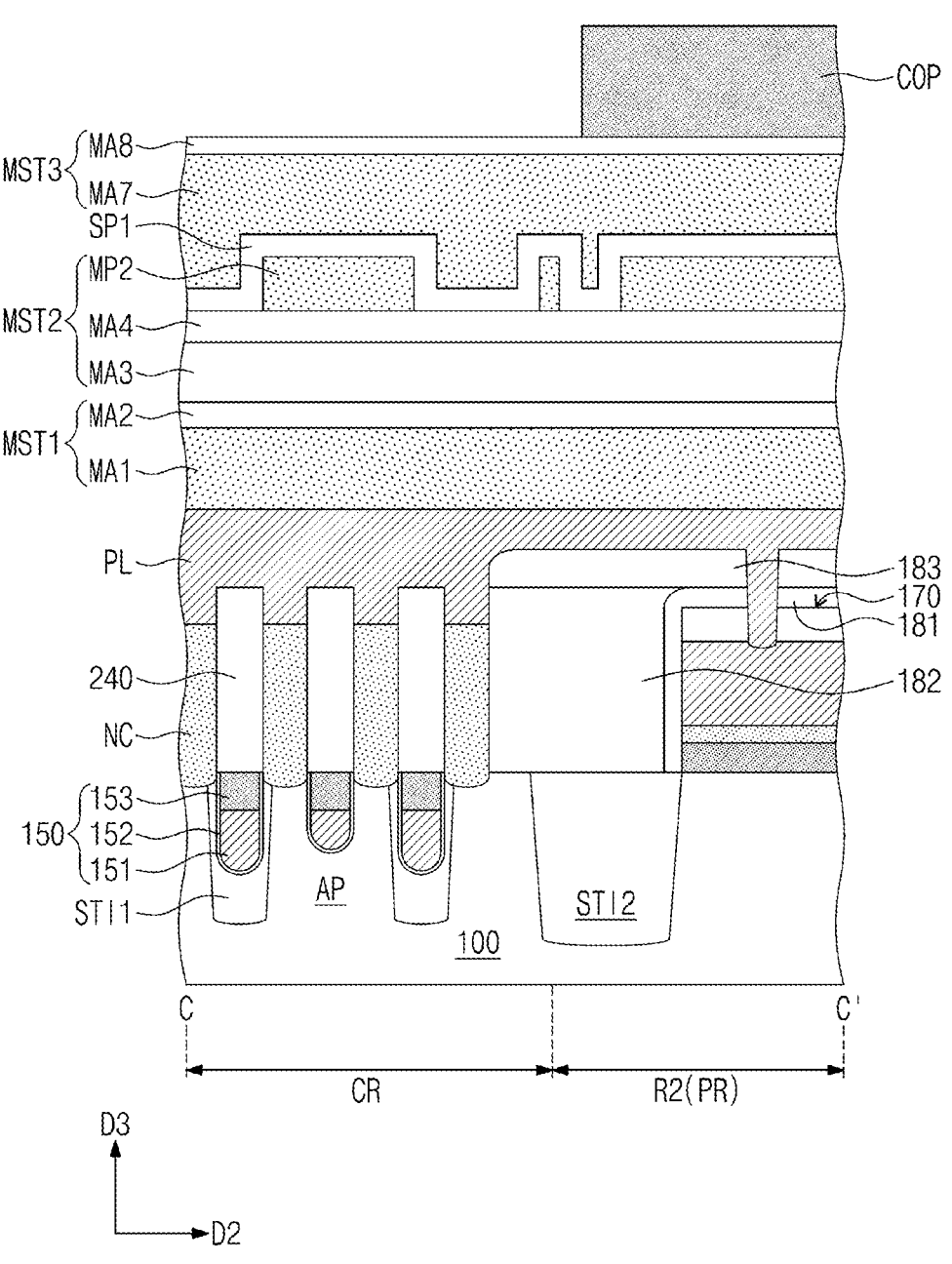

Referring to FIGS. 6A and 6B, a third mask structure MST3 may be formed on the first spacer layer SP1. The third mask structure MST3 may include a seventh mask layer MA7 on the first spacer layer SP1 and an eighth mask layer MA8 on the seventh mask layer MA7. The seventh mask layer MA7 may include a material having an etch selectivity with respect to the first spacer layer SP1. For example, the seventh mask layer MA7 may include a spin-on-hardmask (SOH) layer. The eighth mask layer MA8 may include a material having an etch selectivity with respect to the seventh mask layer MA7. For example, the eighth mask layer MA8 may include silicon oxynitride.

A cell open photoresist layer COP may be formed on the eighth mask layer MA8 of the third mask structure MST3. The eighth mask layer MA8 of the third mask structure MST3 may include a portion that overlaps the cell region CR, and the cell open photoresist layer COP may expose the overlapped portion of the eighth mask layer MA8. The cell open photoresist layer COP may overlap in the third direction D3 with the peripheral region PR.

Figure 7A:
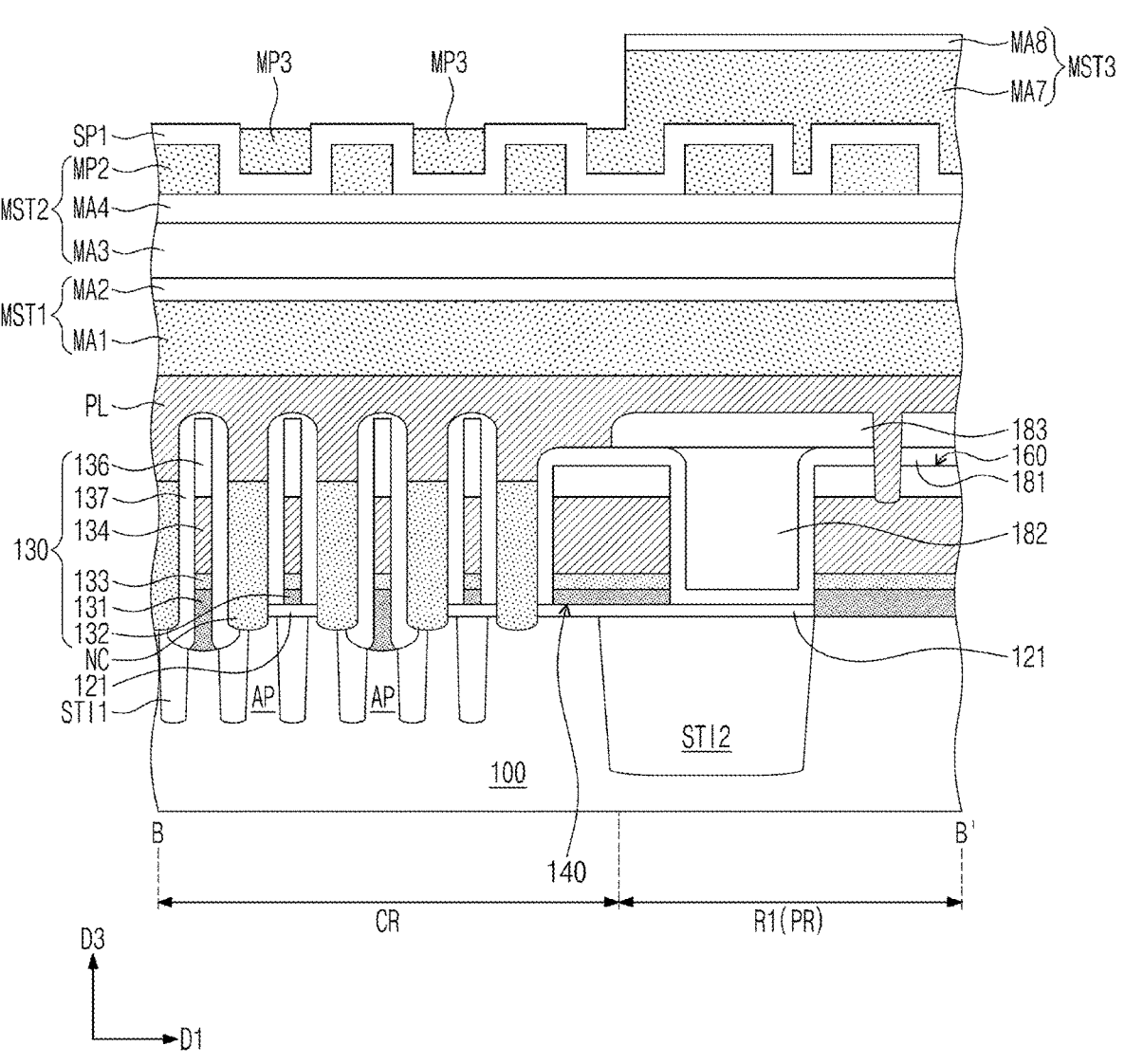
Figure 7B:
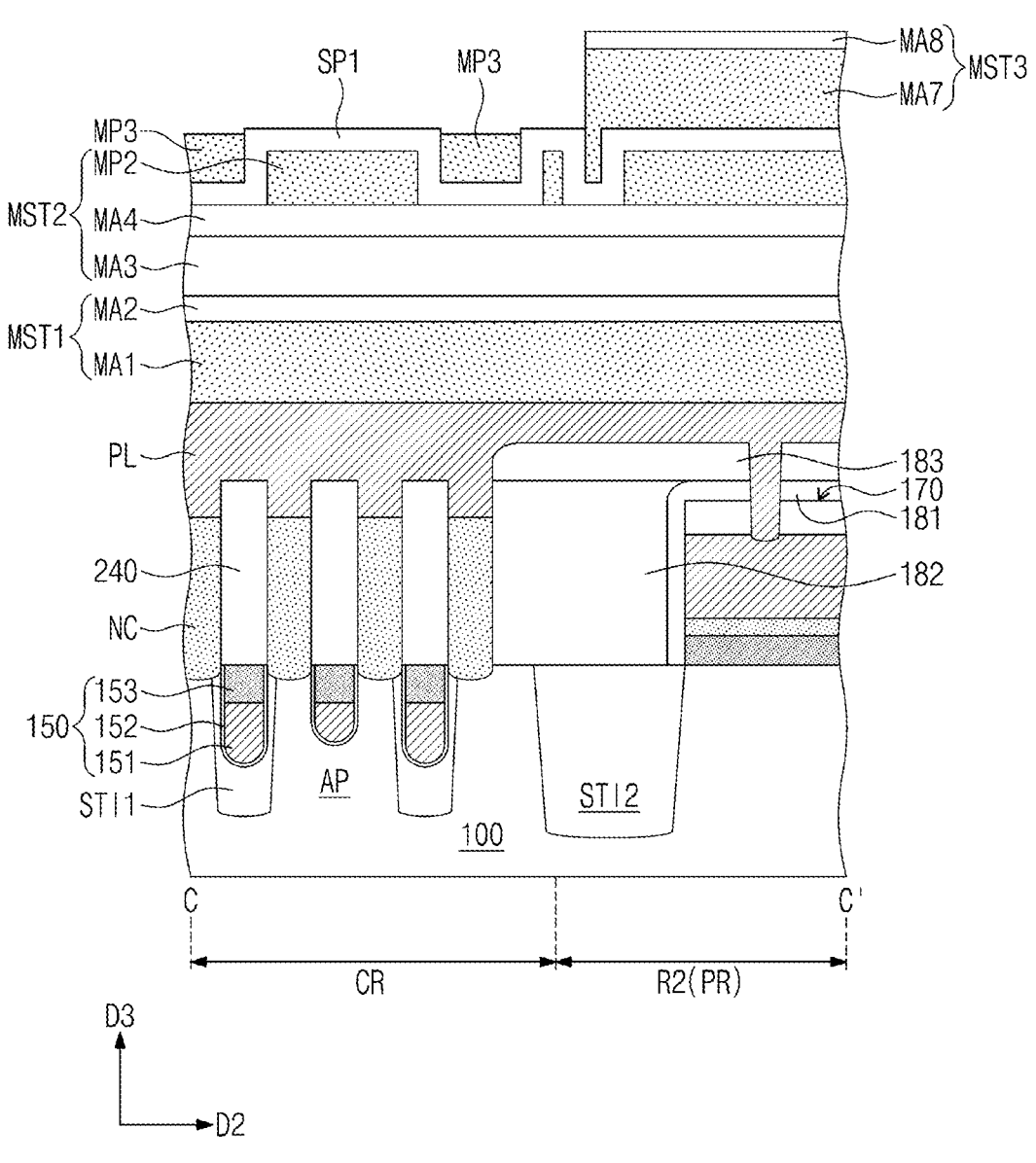

Referring to FIGS. 7A and 7B, the cell open photoresist layer COP may be used as an etching mask to etch the third mask structure MST3. The eighth mask layer MA8 of the third mask structure MST3 may include a portion that overlaps in the third direction D3 with the cell region CR, and the overlapped portion of the eighth mask layer MA8 may be removed through the etching process. After the eighth mask layer MA8 is etched, the cell open photoresist layer COP may be removed. An etch-back process may be adopted to etch the eighth mask layer MA8.

The etched eighth mask layer MA8 may be used as an etching mask to etch the seventh mask layer MA7. The seventh mask layer MA7 may be etched at its portion that overlaps in the third direction D3 with the cell region CR. The first spacer layer SP1 may include a portion that overlaps in the third direction D3 with the cell region CR, and the overlapped portion of the first spacer layer SP1 may be exposed through the etching process. The seventh mask layer MA7 may include a portion that overlaps in the third direction D3 with the cell region CR, and the overlapped portion of the seventh mask layer MA7 may be etched to form third mask patterns MP3 that overlap in the third direction D3 with the cell region CR. The third mask patterns MP3 may be remaining non-etched parts of the portions of the seventh mask layer MA7 that overlap in the third direction D3 with the cell region CR. The third mask patterns MP3 may be provided on the first spacer layer SP1. The third mask patterns MP3 may be disposed between the second mask patterns MP2.

Figure 8A:
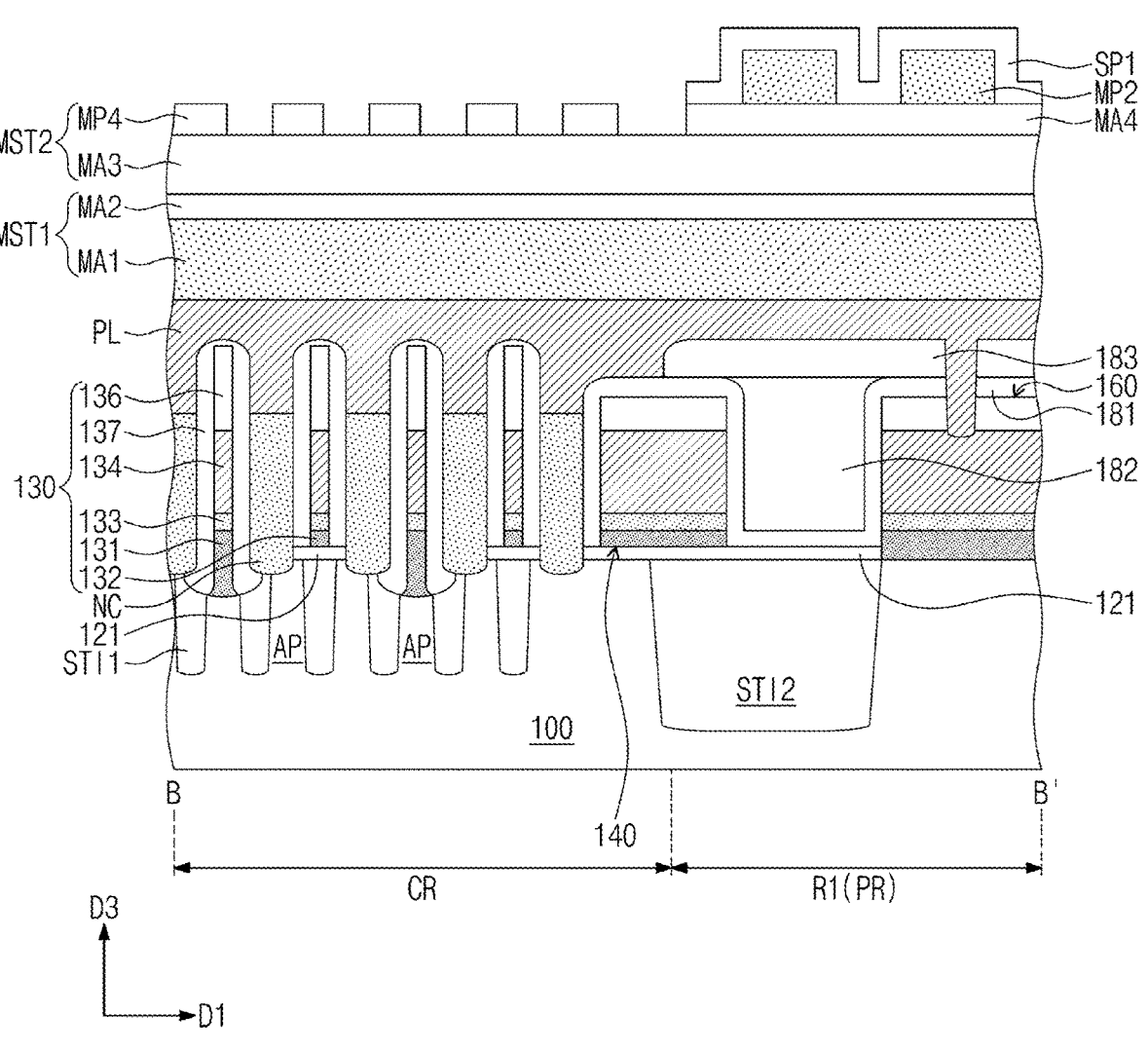
Figure 8B:
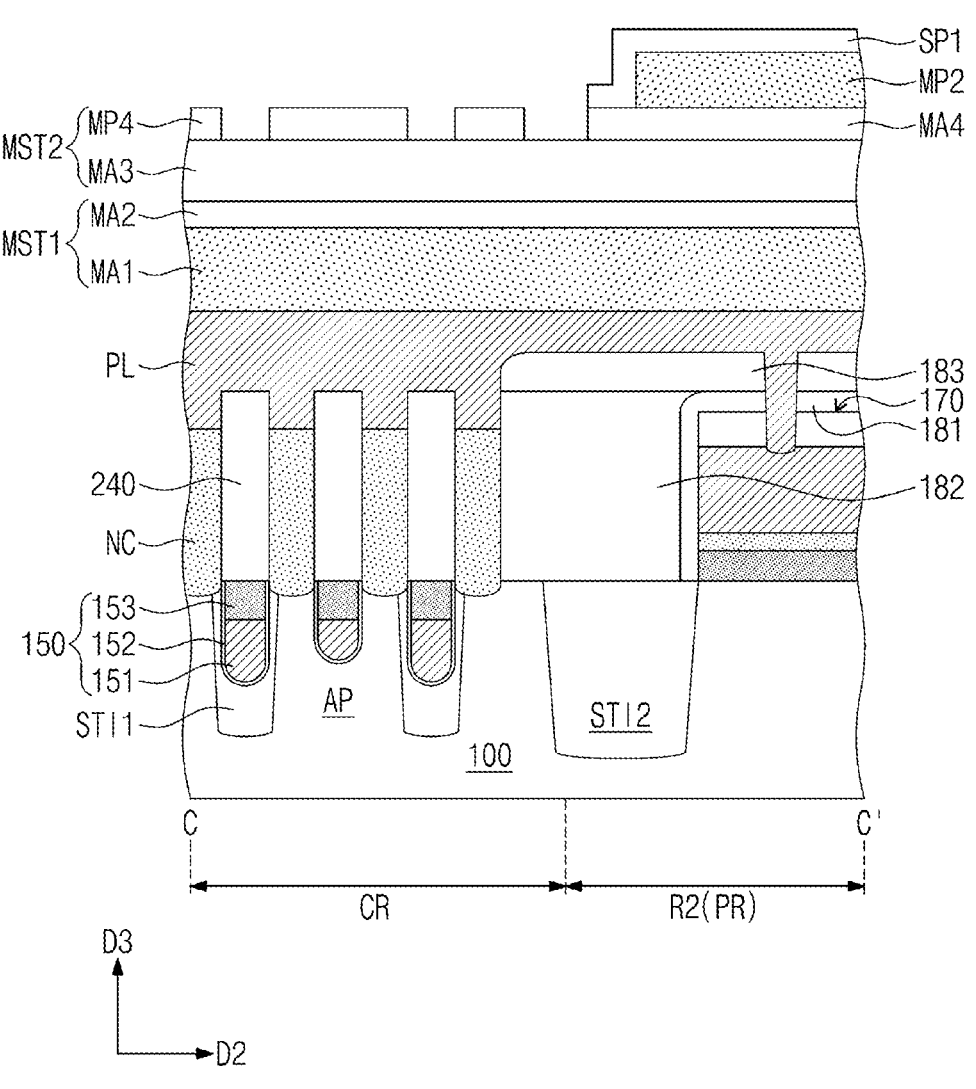

Referring to FIGS. 8A and 8B, the first spacer layer SP1 may be etched. The etching process may remove exposed portions of the first spacer layer SP1. The first spacer layer SP1 may include a portion covered with the seventh mask layer MA7 and the third mask pattern MP3, and the covered portion of the first spacer layer SP1 may not be removed (e.g., in the first and second regions R1 and R2 of FIGS. 8A and 8B). The first spacer layer SP1 may be etched to form a first space, and the first space may expose the fourth mask layer MA4 (e.g., the first space may expose the fourth mask layer MA4 between adjacent ones of the second and third mask patterns MP2 and MP3). Before or after the first spacer layer SP1 is etched, the eighth mask layer MA8 may be removed.

The fourth mask layer MA4 may be etched through the first space. The second and third mask patterns MP2 and MP3 may be used as an etching mask to etch the fourth mask layer MA4. The fourth mask layer MA4 may be etched to form fourth mask patterns MP4. The fourth mask patterns MP4 may overlap in the third direction D3 with the cell region CR. The second mask patterns MP2 and third mask patterns MP3 may be transferred to form the fourth mask patterns MP4. After the formation of the fourth mask patterns MP4, the seventh mask layer MA7, the third mask patterns MP3, the second mask patterns MP2, and a portion of the first spacer layer SP1 that overlap in the third direction D3 with the cell region CR may be removed. For example, an ashing process may remove the seventh mask layer MA7, the third mask patterns MP3, and the second mask patterns MP2 overlapping in the third direction D3 with the cell region CR. In some embodiments, a strip process may be performed after the removal of the seventh mask layer MA7, the third mask patterns MP3, and the second mask patterns MP2 overlapping in the third direction D3 with the cell region CR. For example, as illustrated in FIGS. 8A and 8B, a portion of the first spacer layer SP1 that does not overlap in the third direction D3 with the cell region CR may remain (i.e., a portion in the first and second regions R1 and R2 of the peripheral region PR).

Figure 9A:
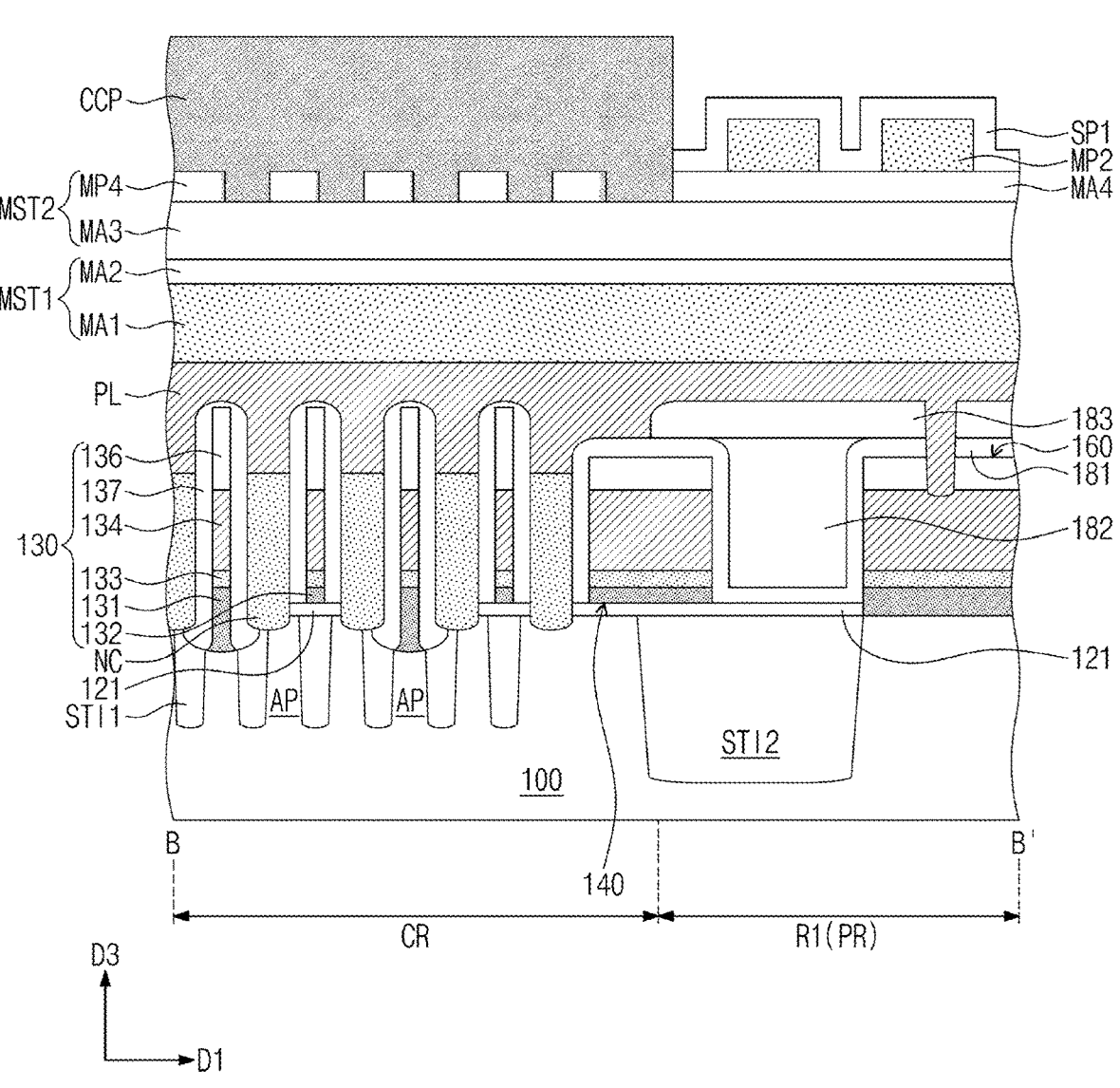
Figure 9B:
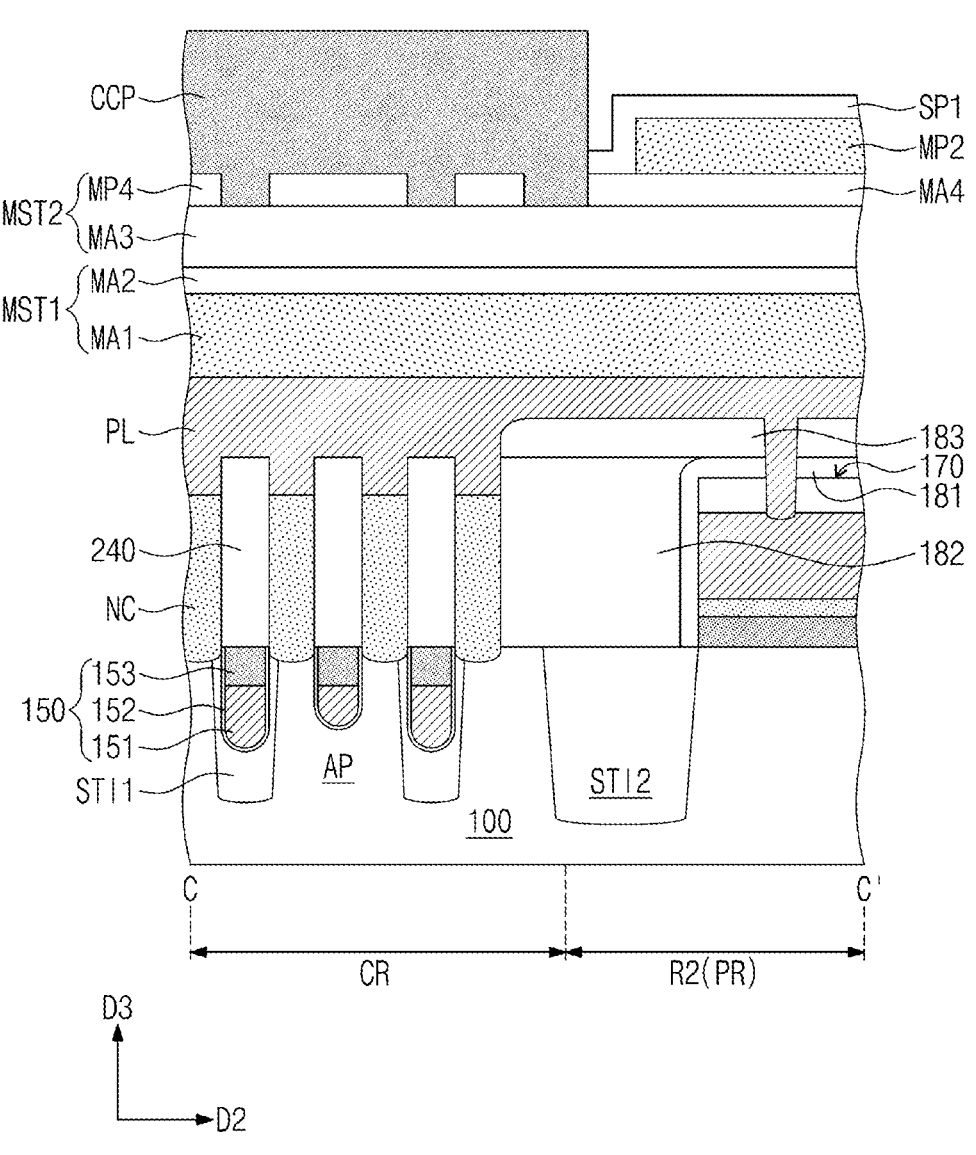

Referring to FIGS. 9A and 9B, a cell close photoresist layer CCP may be formed on the fourth mask patterns MP4 of the second mask structure MST2. The cell close photoresist layer CCP may expose the first spacer layer SP1 that overlaps in the third direction D3 with the peripheral region PR. The cell close photoresist layer CCP may overlap in the third direction D3 with the cell region CR.

Figure 10A:
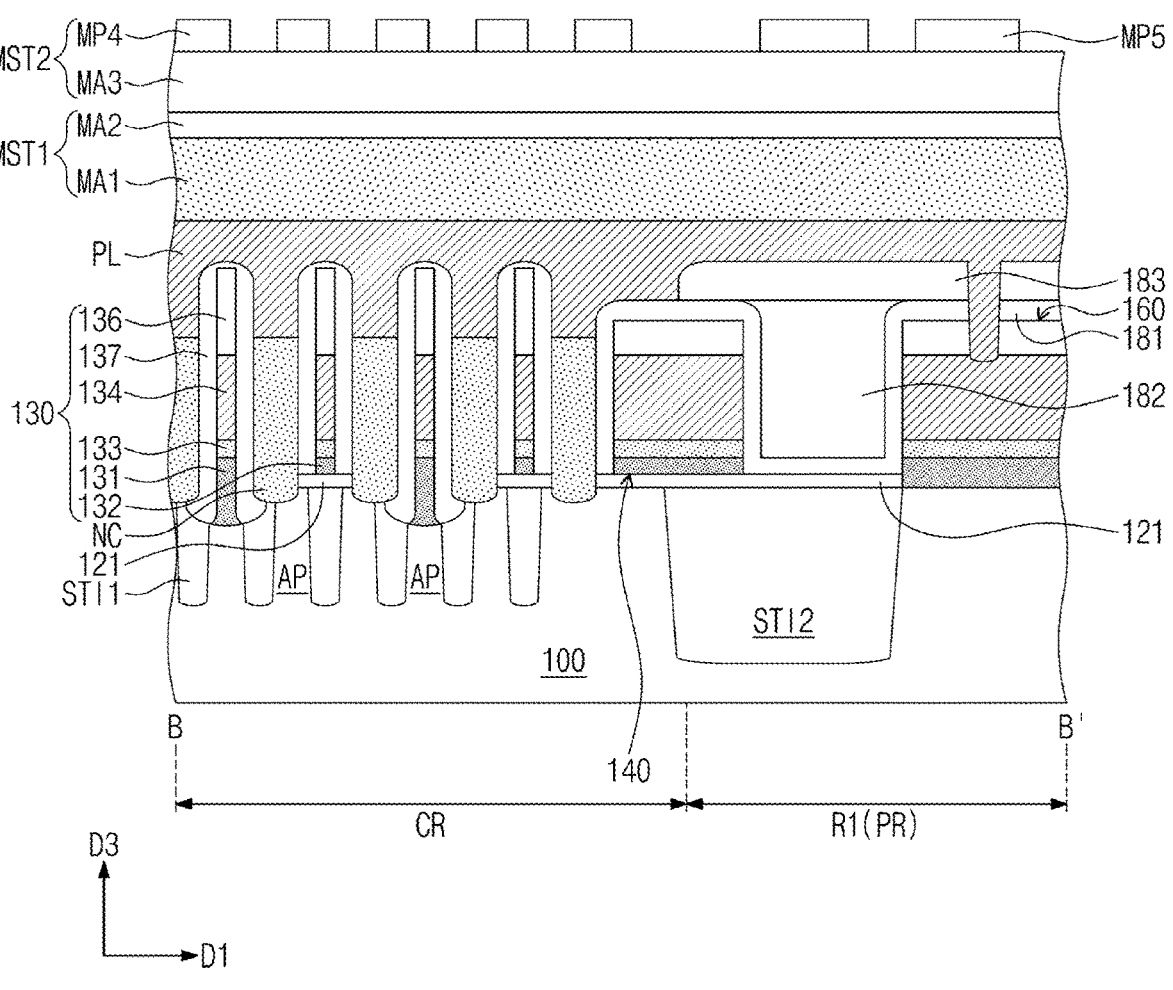
Figure 10B:
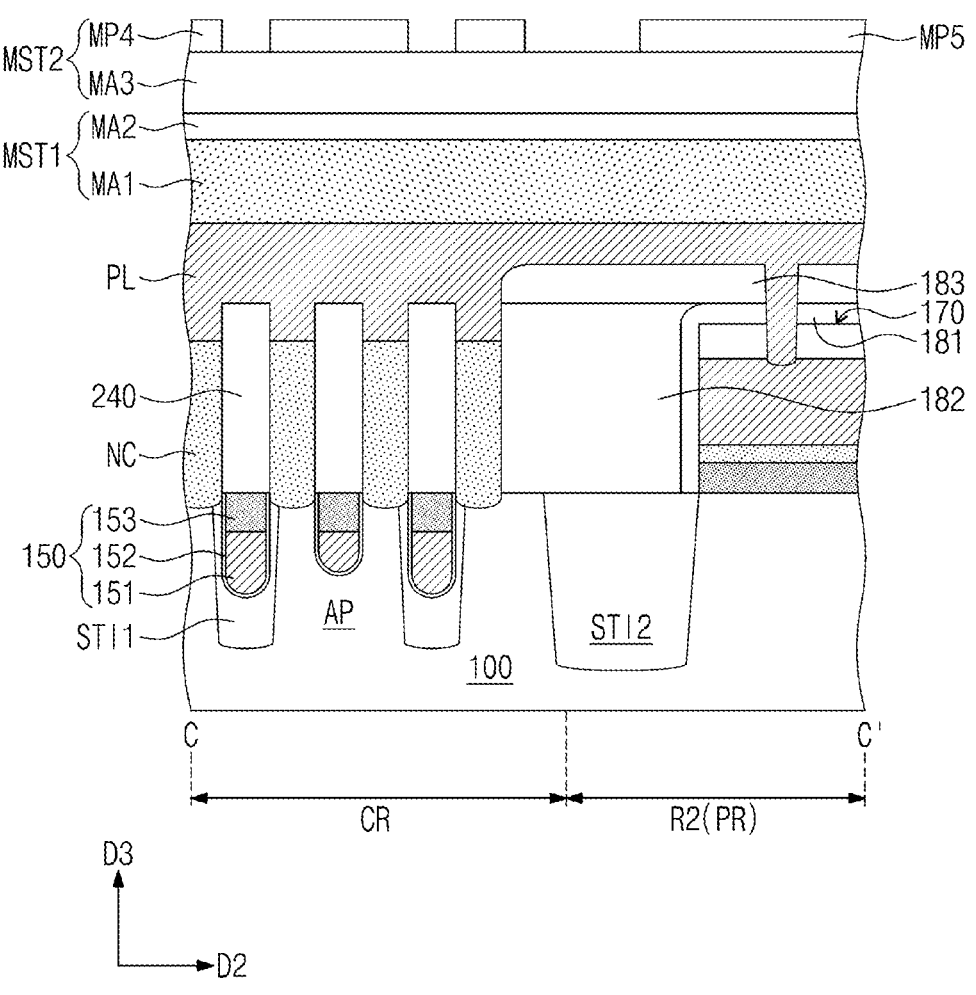

Referring to FIGS. 10A and 10B, the cell close photoresist layer CCP may be used as an etching mask to etch the first spacer layer SP1. The etching process may remove the first spacer layer SP1, and may expose the second mask patterns MP2 that overlap in the third direction D3 with the peripheral region PR.

The second mask patterns MP2, which overlap in the third direction D3 with the peripheral region PR, may be used as an etching mask to etch the fourth mask layer MA4 that overlaps in the third direction D3 with the peripheral region PR. Fifth mask patterns MP5 may be formed by etching the fourth mask layer MA4 that overlaps in the third direction D3 with the peripheral region PR. The fifth mask patterns MP5 may overlap in the third direction D3 with the peripheral region PR. After the formation of the fifth mask patterns MP5, the second mask patterns MP2 may be removed which overlap in the third direction D3 with the peripheral region PR.

Figure 11A:
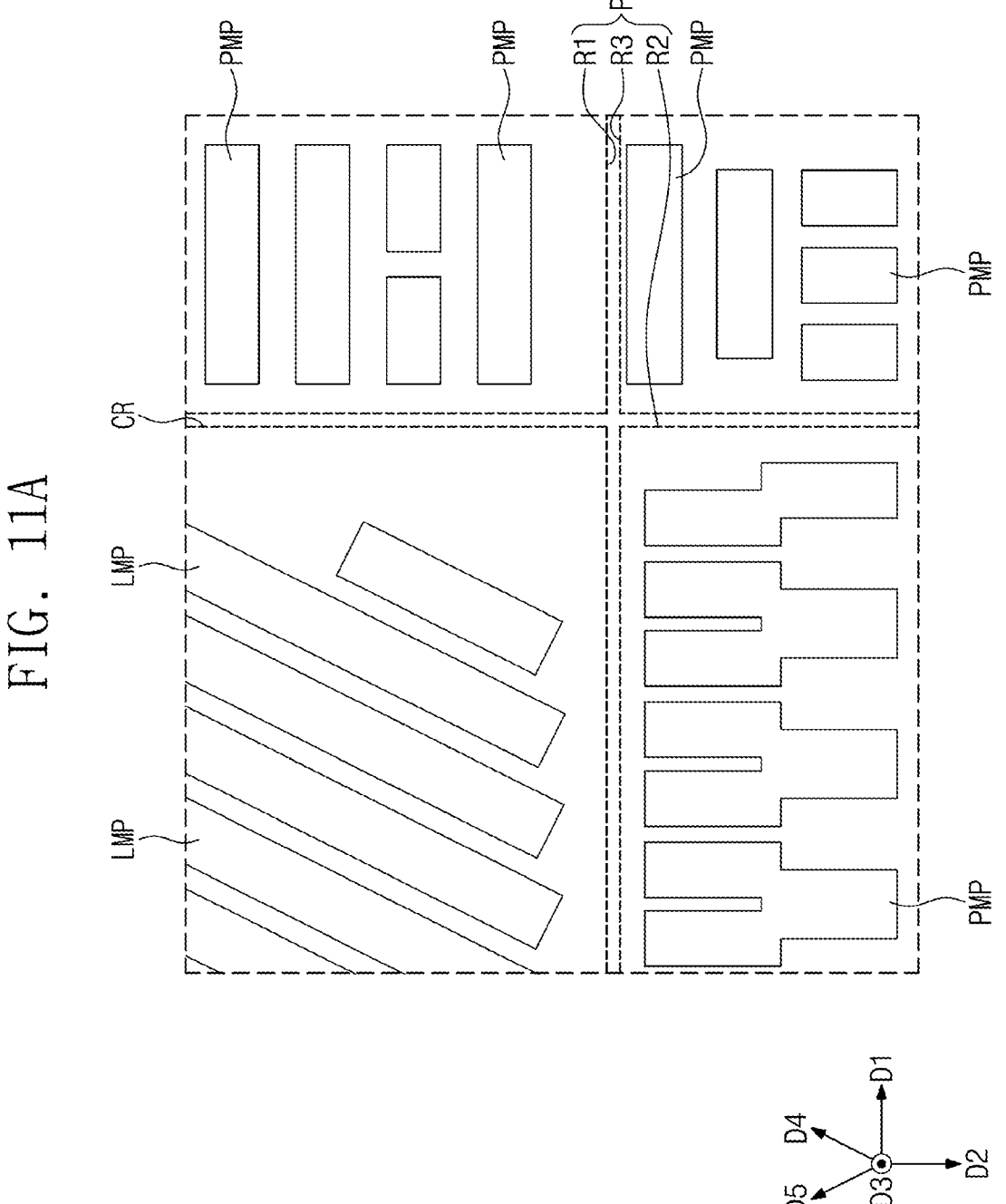
Figure 11B:
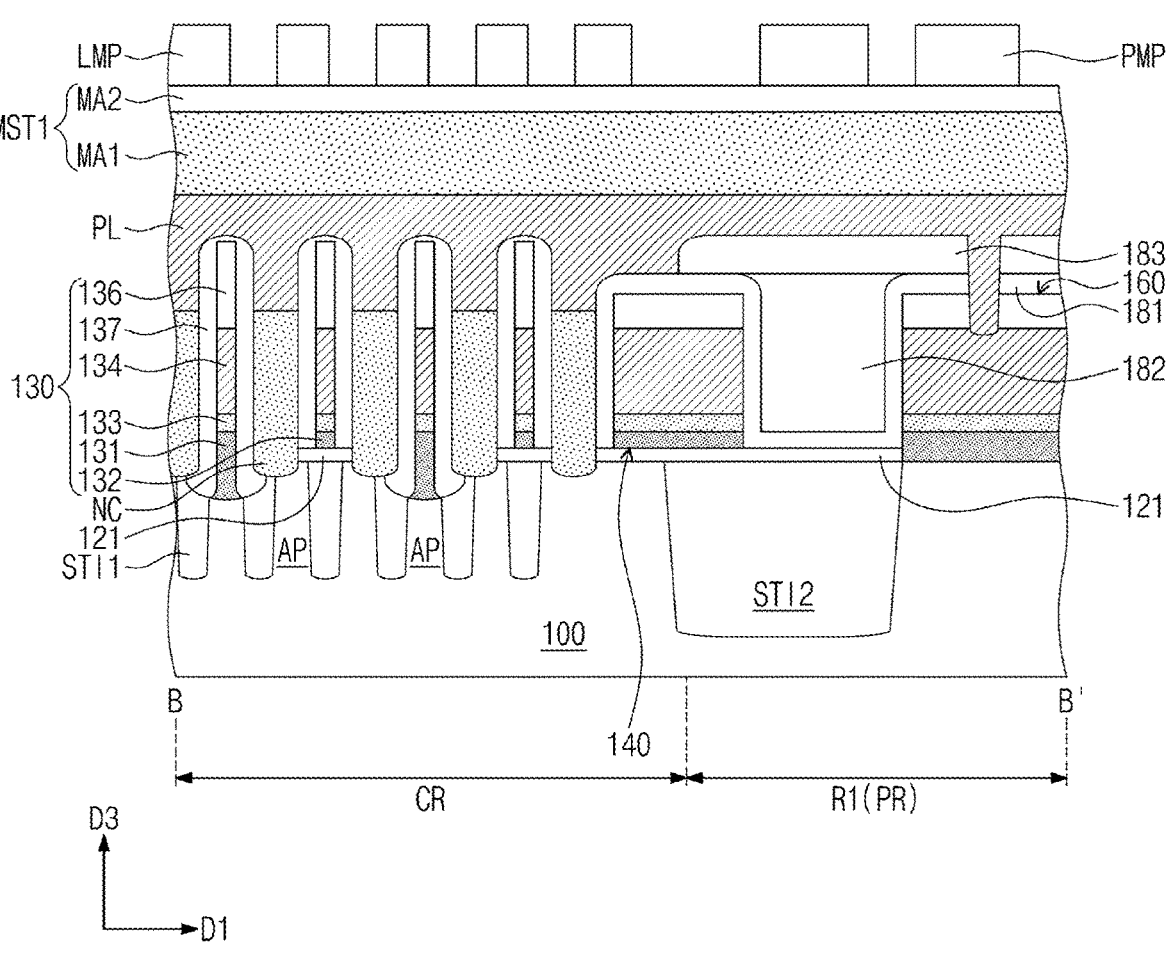
Figure 11C:
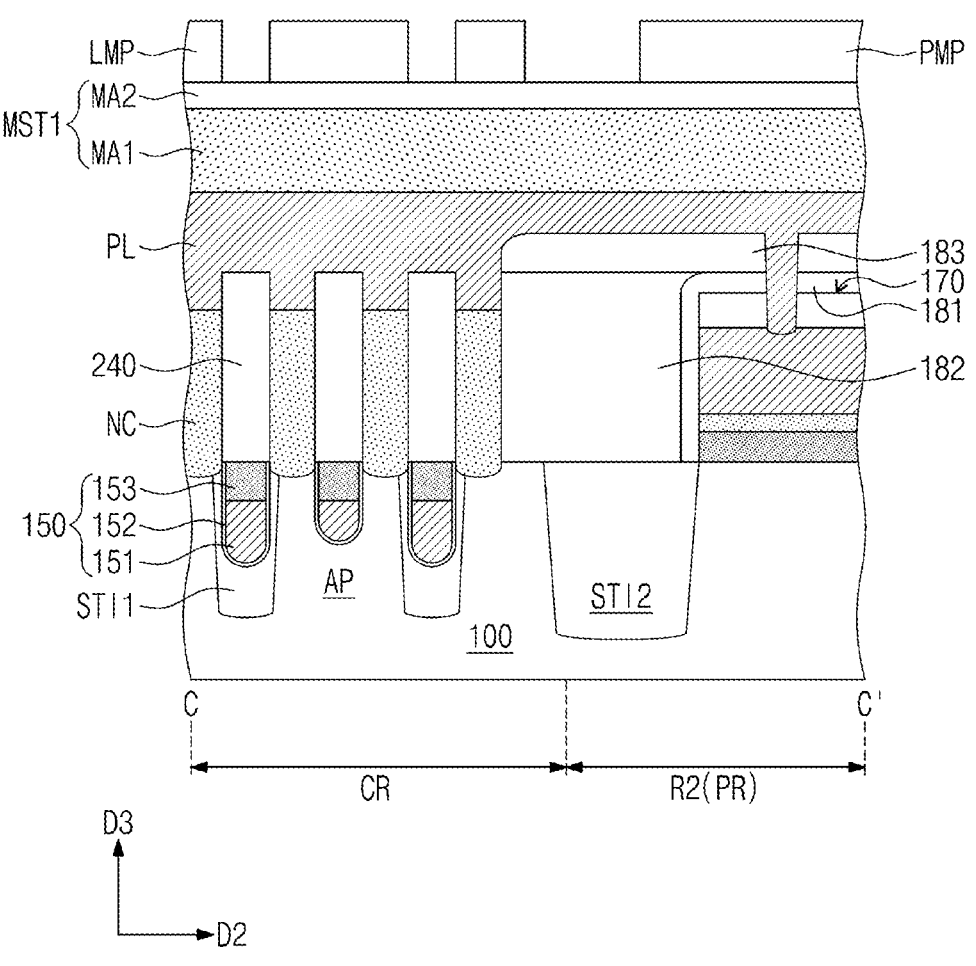

Referring to FIGS. 11A, 11B, and 11C, the fourth and fifth mask patterns MP4 and MP5 may be used as an etching mask to etch the third mask layer MA3. The third mask layer MA3 may be etched to simultaneously form line mask patterns LMP and peripheral mask patterns PMP. The line mask patterns LMP may overlap in the third direction D3 with the cell region CR. The peripheral mask patterns PMP may overlap in the third direction D3 with the peripheral region PR. The line mask patterns LMP may extend in the fourth direction D4.

Figure 12A:
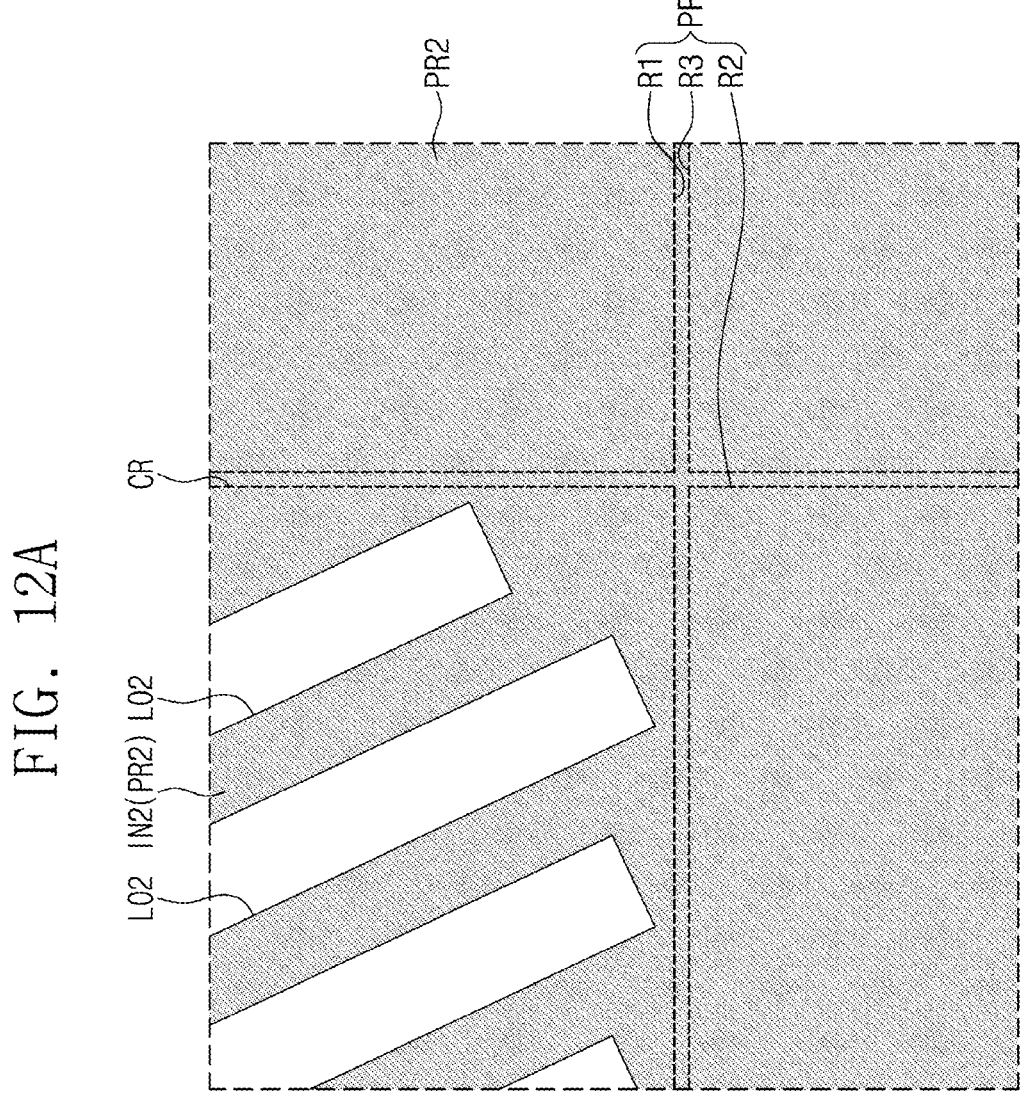
Figure 12B:
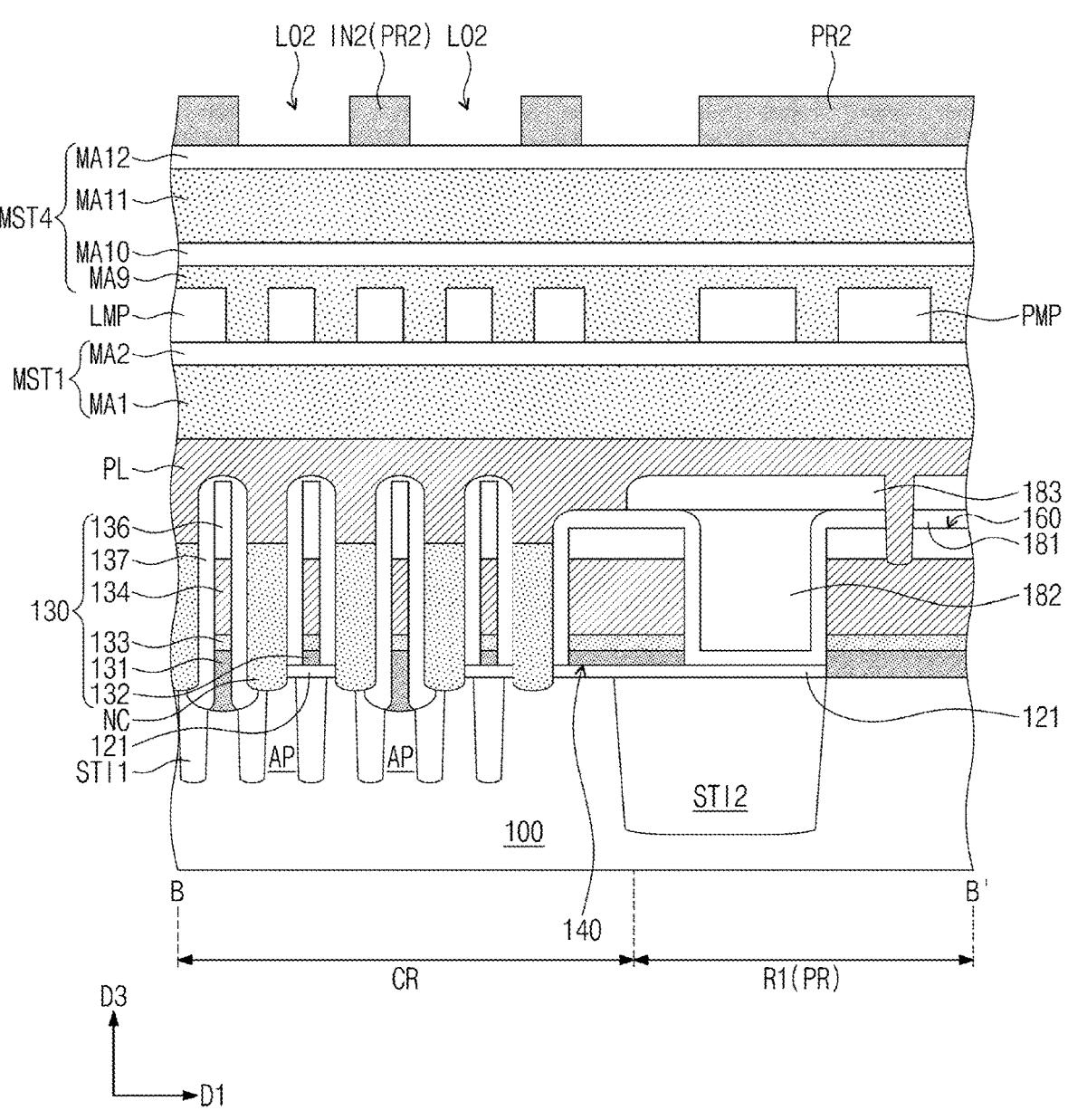
Figure 12C:
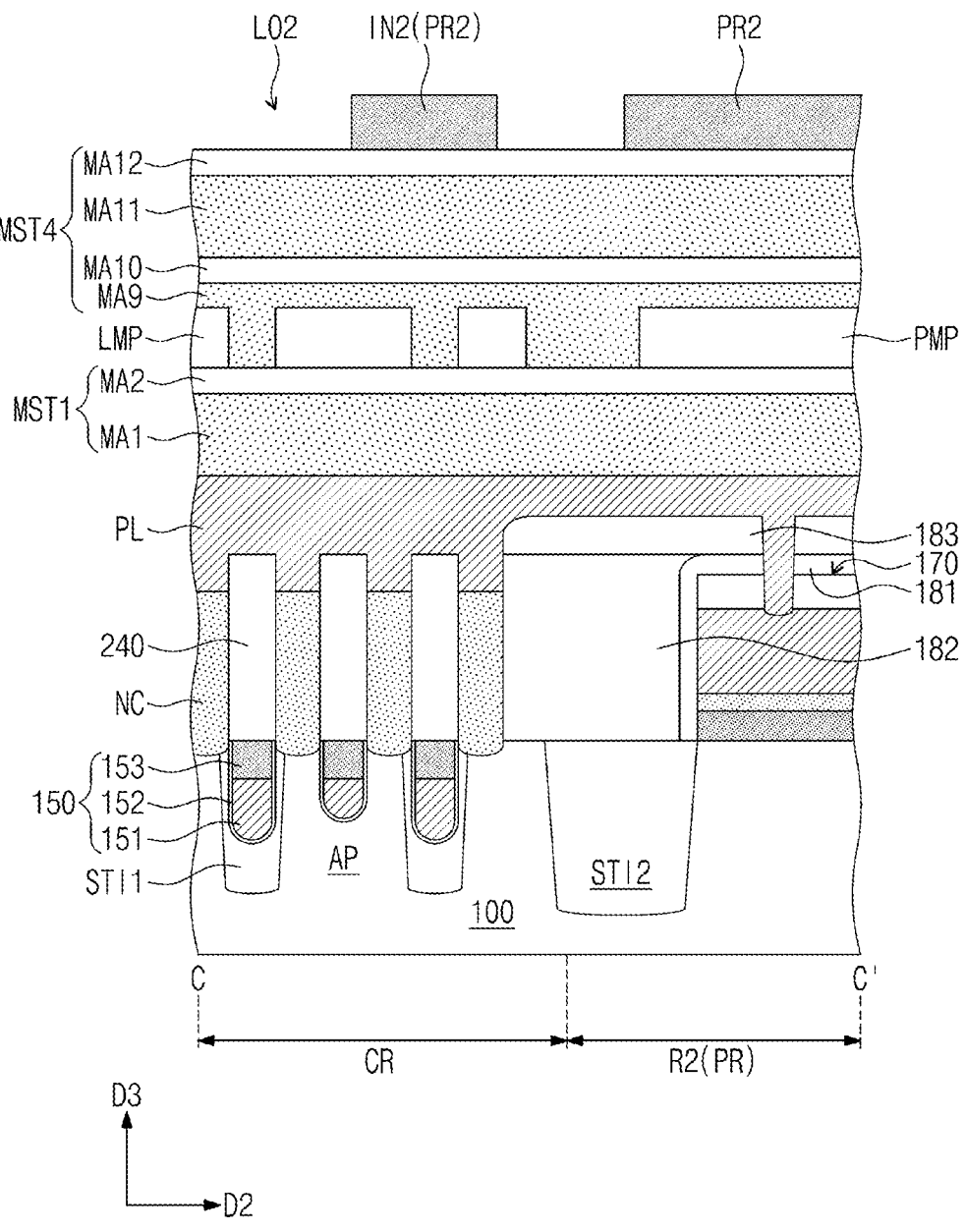

Referring to FIGS. 12A, 12B, and 12C, a fourth mask structure MST4 may be formed on the line mask patterns LMP and the peripheral mask patterns PMP. The fourth mask structure MST4 may include a ninth mask layer MA9 on the second mask layer MA2 of the first mask structure MST1, the line mask patterns LMP, and the peripheral mask patterns PMP, a tenth mask layer MA10 on the ninth mask layer MA9, an eleventh mask layer MA11 on the tenth mask layer MA10, and a twelfth mask layer MA12 on the eleventh mask layer MA11.

The ninth mask layer MA9 may include a material having an etch selectivity with respect to the second mask layer MA2, the line mask patterns LMP, and the peripheral mask patterns PMP. For example, the ninth mask layer MA9 may include a spin-on-hardmask (SOH) layer. The tenth mask layer MA10 may include a material having an etch selectivity with respect to the ninth mask layer MA9. For example, the tenth mask layer MA10 may include silicon oxynitride. The eleventh mask layer MA11 may include a material having an etch selectivity with respect to the tenth mask layer MA10. For example, the eleventh mask layer MA11 may include a spin-on-hardmask (SOH) layer. The twelfth mask layer MA12 may include a material having an etch selectivity with respect to the eleventh mask layer MA11. For example, the twelfth mask layer MA12 may include silicon oxynitride.

A second photoresist layer PR2 may be formed on the fourth mask structure MST4. The formation of the second photoresist layer PR2 may include forming a second preliminary photoresist layer and performing exposure and development processes on the second preliminary photoresist layer. For example, the exposure process of the second preliminary photoresist layer may be an extreme ultraviolet (EUV) exposure process.

The peripheral region PR may completely overlap in the third direction D3 with the second photoresist layer PR2. For example, an entirety of the peripheral region PR may overlap in the third direction D3 with the second photoresist layer PR2. The second photoresist layer PR2 may not include an opening that overlaps the peripheral region PR.

The second photoresist layer PR2 may include second line openings LO2. The second line openings LO2 may extend in a fifth direction D5. The fifth direction D5 may intersect the first direction D1, the second direction D2, the third direction D3, and the fourth direction D4. For example, the fifth direction D5 may be perpendicular to the third direction D3. For example, as illustrated in FIG. 12A, the fifth direction D5 may be parallel to the top surface of the substrate 100 and extend at an oblique angle (e.g., diagonally) with respect to each of the first and second directions D1 and D2. The second line openings LO2 may be spaced apart from each other, e.g., the second line openings LO2 may be parallel to each other. The second line openings LO2 may overlap in the third direction D3 with the cell region CR, e.g., the second line openings LO2 may overlap in the third direction D3 only with the cell region CR among the cell region CR and the peripheral region PR. The second line opening LO2 may intersect the first line opening LO1.

The second photoresist layer PR2 may include a second intervening part IN2 disposed between the second line openings LO2. The second intervening part IN2 may extend in the fifth direction D5. The second intervening part IN2 of the second photoresist layer PR2 may have sidewalls that extend in the fifth direction D5. The twelfth mask layer MA12 of the fourth mask structure MST4 may be exposed through the second line opening LO2.

Figure 13A:
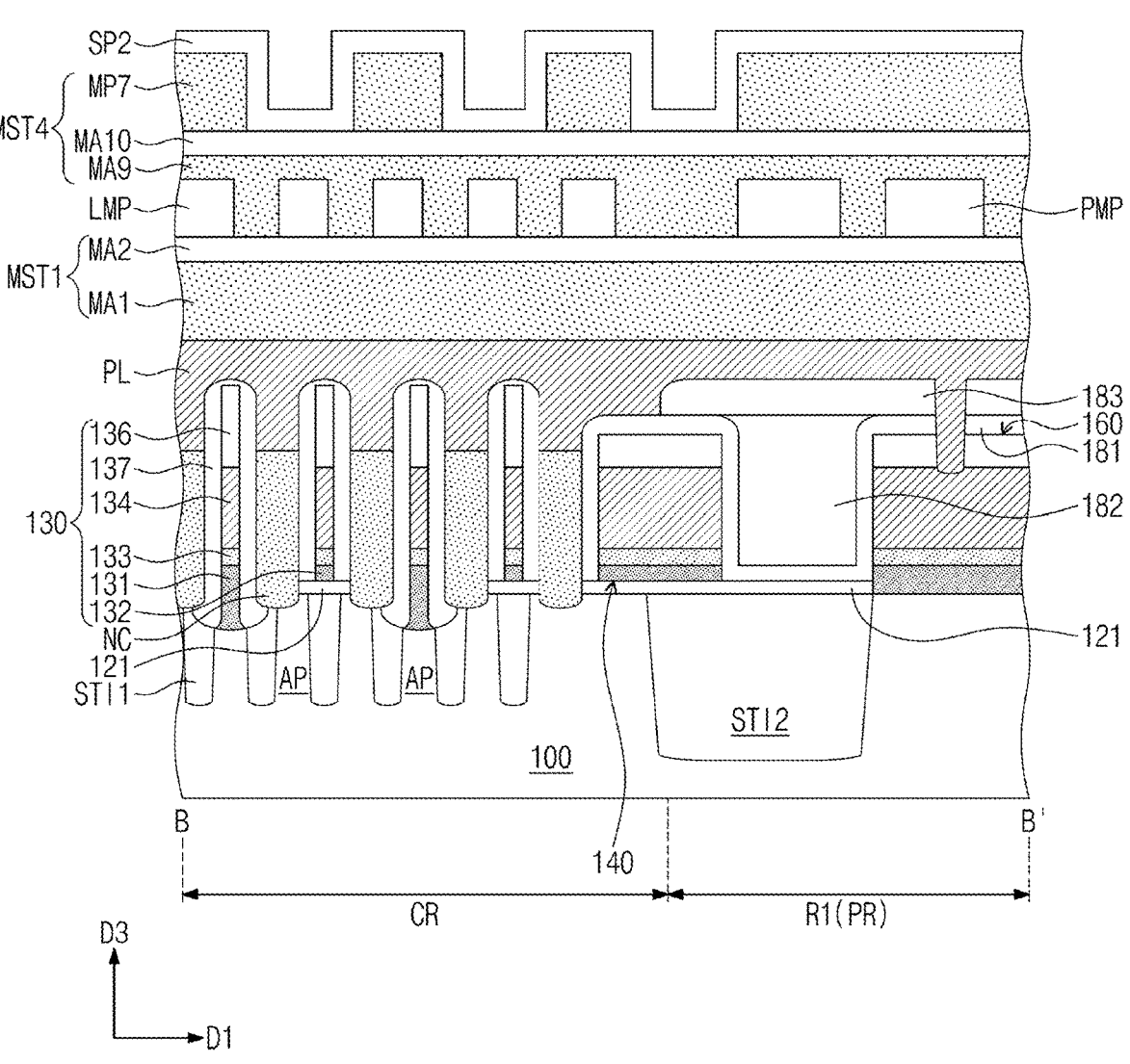
Figure 13B:
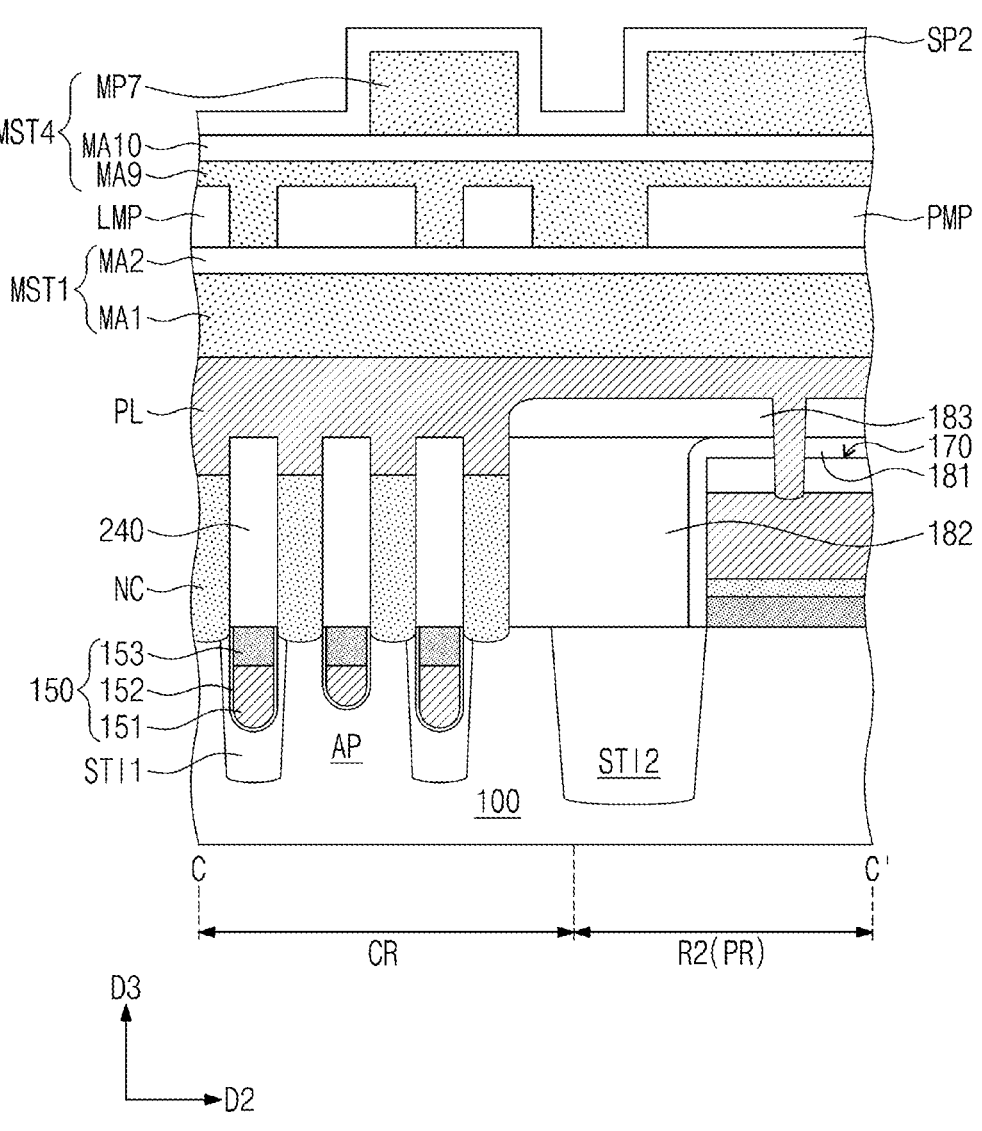

Referring to FIGS. 13A and 13B, the second photoresist layer PR2 may be used as an etching mask to etch the twelfth mask layer MA12 of the fourth mask structure MST4. The twelfth mask layer MA12 may be etched to form sixth mask patterns. The sixth mask patterns may be defined to indicate portions of the twelfth mask layer MA12 that are not removed by etching. After the formation of the sixth mask patterns, the second photoresist layer PR2 may be removed.

The sixth mask patterns may be used as an etching mask to etch the eleventh mask layer MA11. The eleventh mask layer MA11 may be etched to form seventh mask patterns MP7. The seventh mask patterns MP7 may be defined to indicate portions of the eleventh mask layer MA11 that are not removed by etching. After the formation of the seventh mask patterns MP7, the sixth mask patterns may be removed.

A second spacer layer SP2 may be formed which covers the seventh mask patterns MP7 and the tenth mask layer MA10. For example, an atomic layer deposition (ALD) process may be employed to form the second spacer layer SP2. The second spacer layer SP2 may be conformally formed on the tenth mask layer MA10 and the seventh mask patterns MP7. The second spacer layer SP2 may include a dielectric material. For example, the second spacer layer SP2 may include oxide.

Figure 14A:
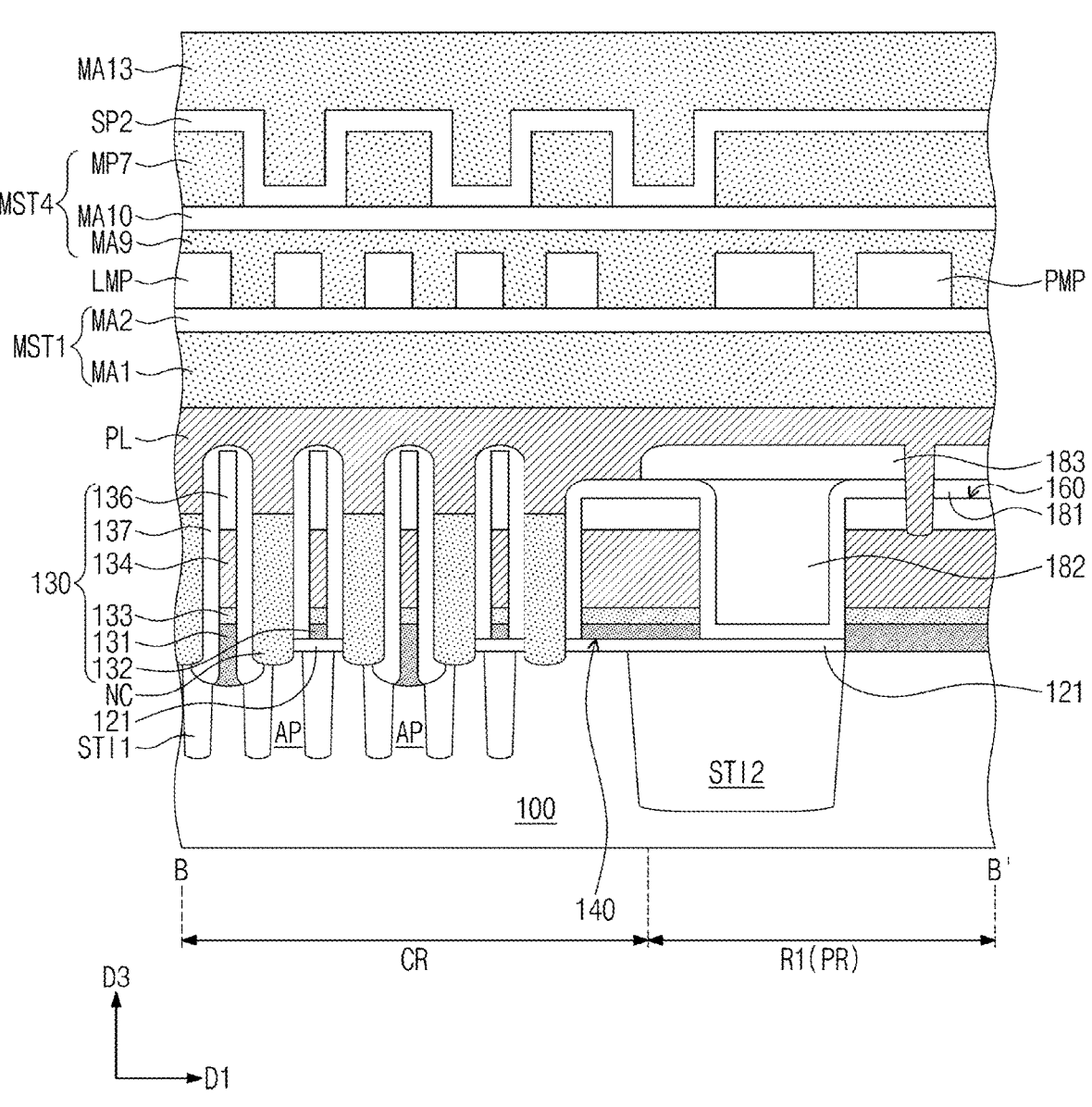
Figure 14B:
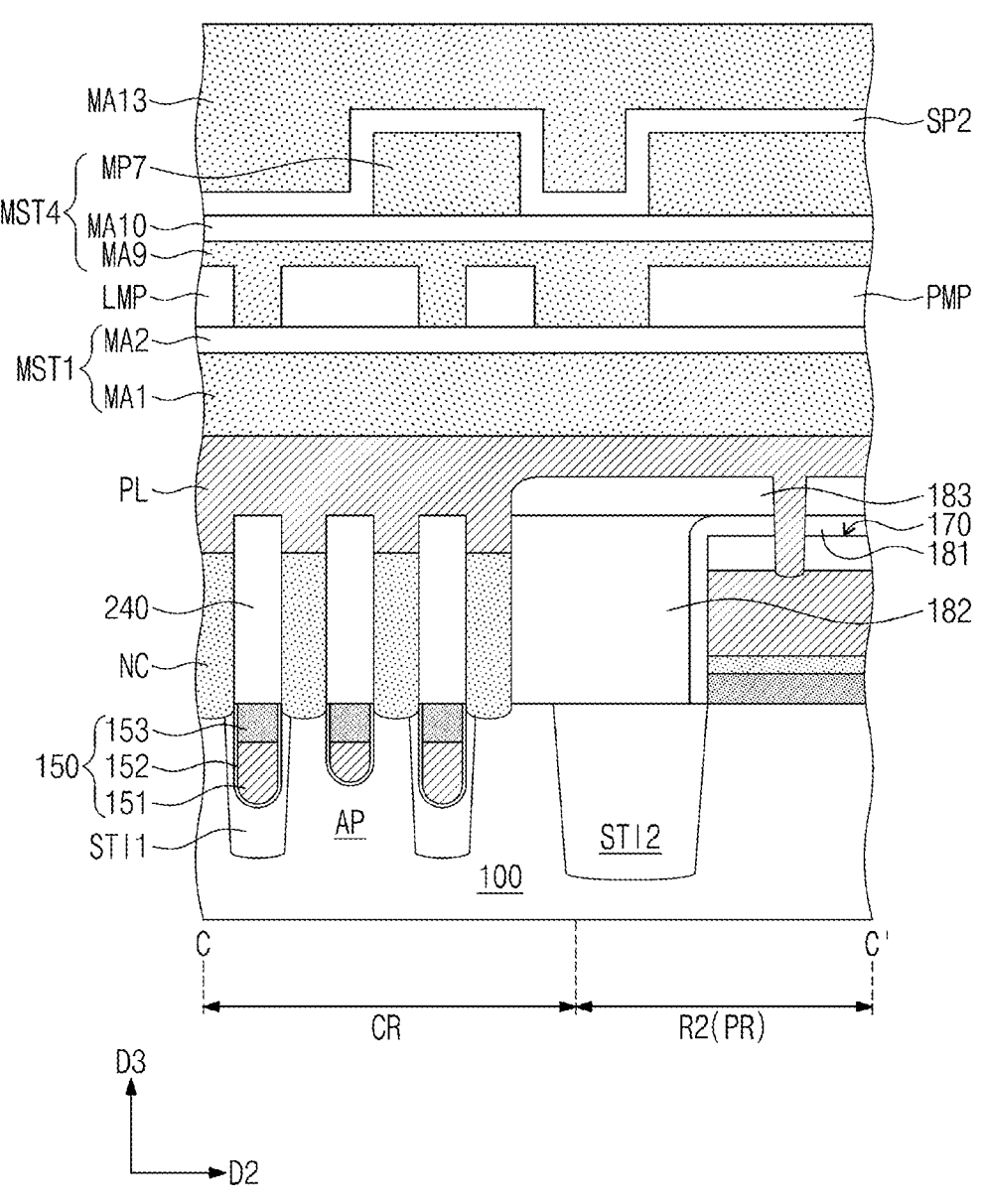

Referring to FIGS. 14A and 14B, a thirteenth mask layer MA13 may be formed on the second spacer layer SP2. The thirteenth mask layer MA13 may include a material having an etch selectivity with respect to the second spacer layer SP2. For example, the thirteenth mask layer MA13 may include a spin-on-hardmask (SOH) layer.

Figure 15A:
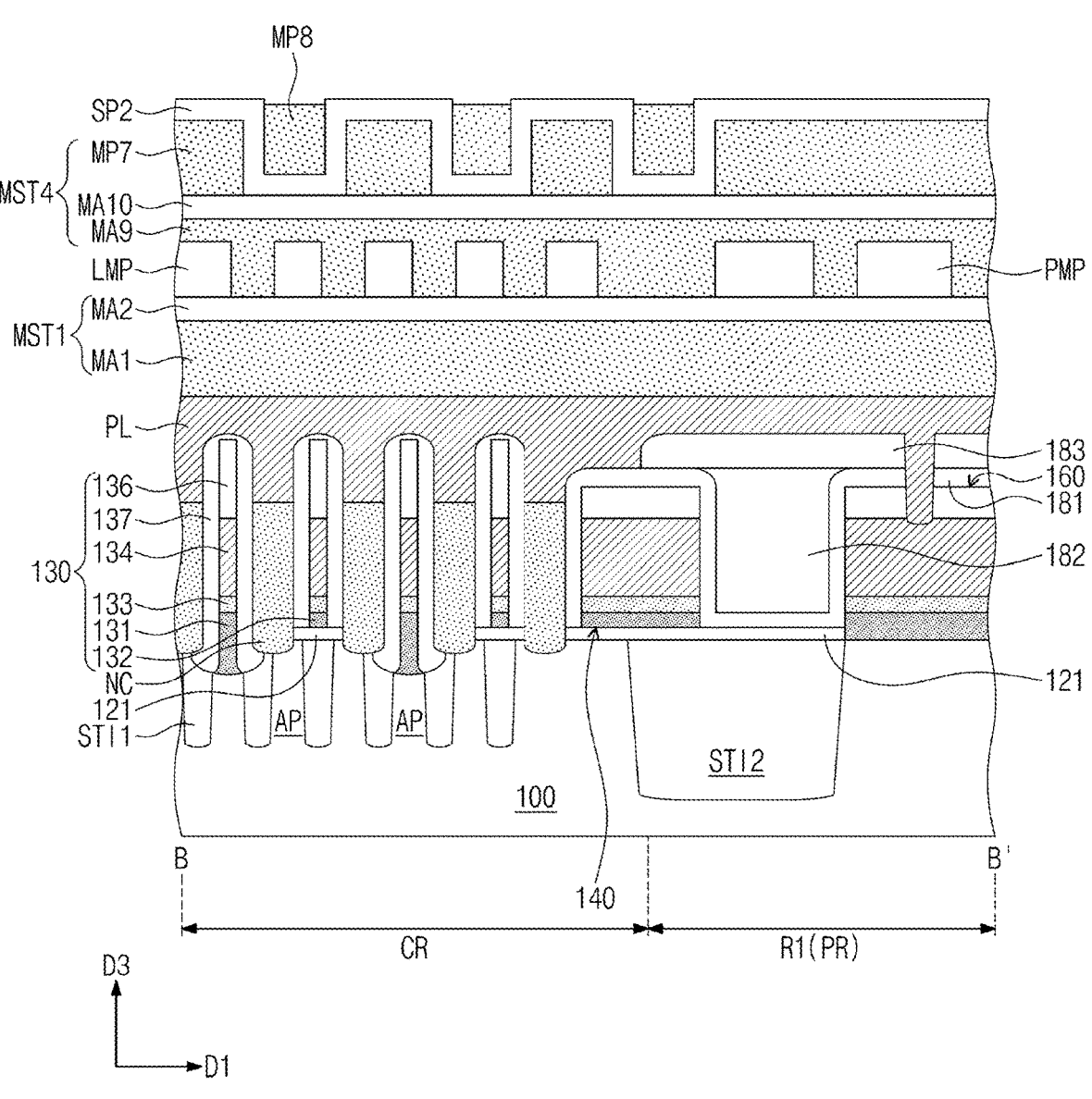
Figure 15B:
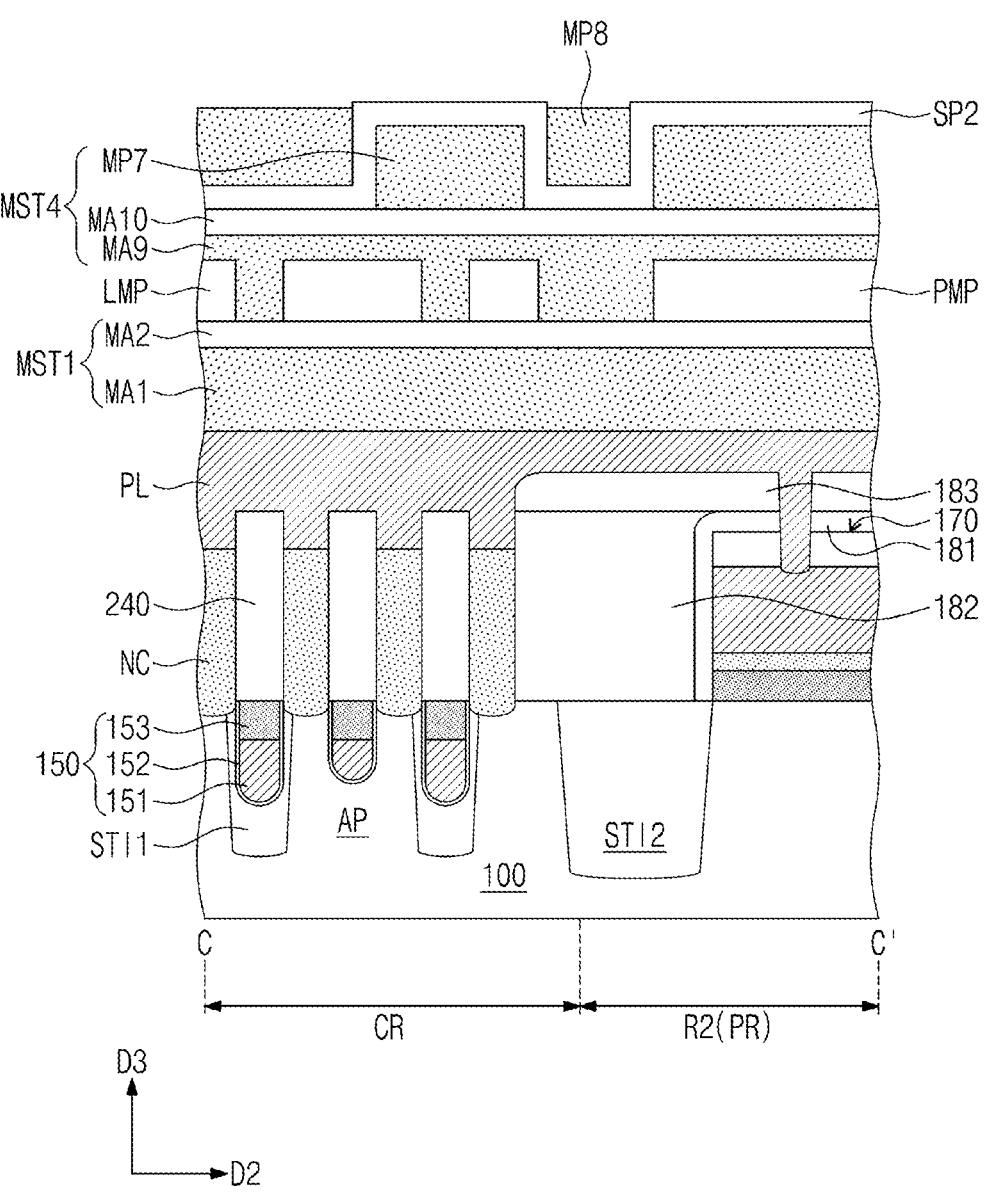

Referring to FIGS. 15A and 15B, the thirteenth mask layer MA13 may be etched. An etch-back process may be employed to etch the thirteenth mask layer MA13. The thirteenth mask layer MA13 may be etched to expose the second spacer layer SP2. The thirteenth mask layer MA13 may be etched to remove an upper portion of the thirteenth mask layer MA13. The upper portion of the thirteenth mask layer MA13 may be etched to form eighth mask patterns MP8 interposed between portions of the second spacer layer SP2.

Figure 16A:
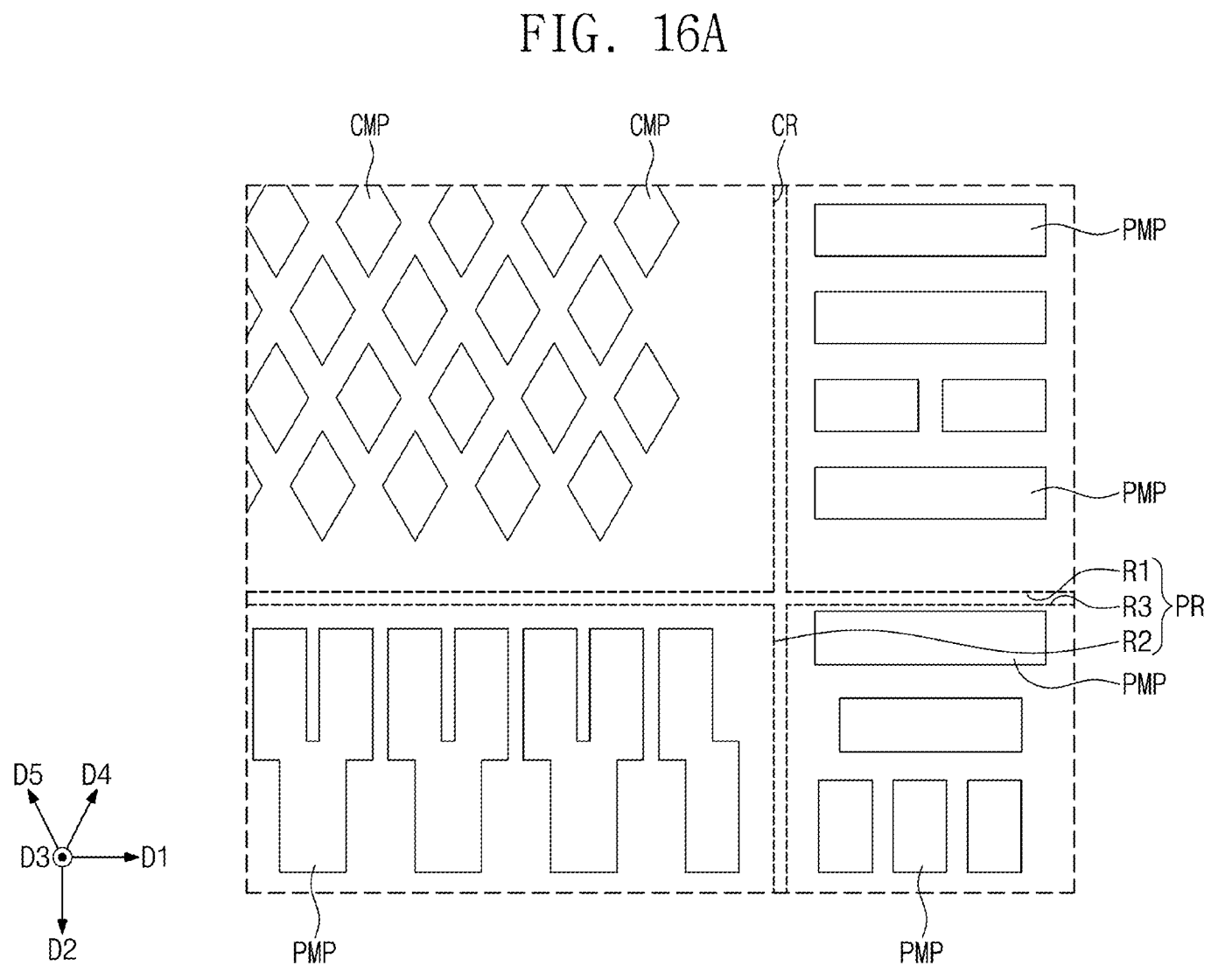
Figure 16B:
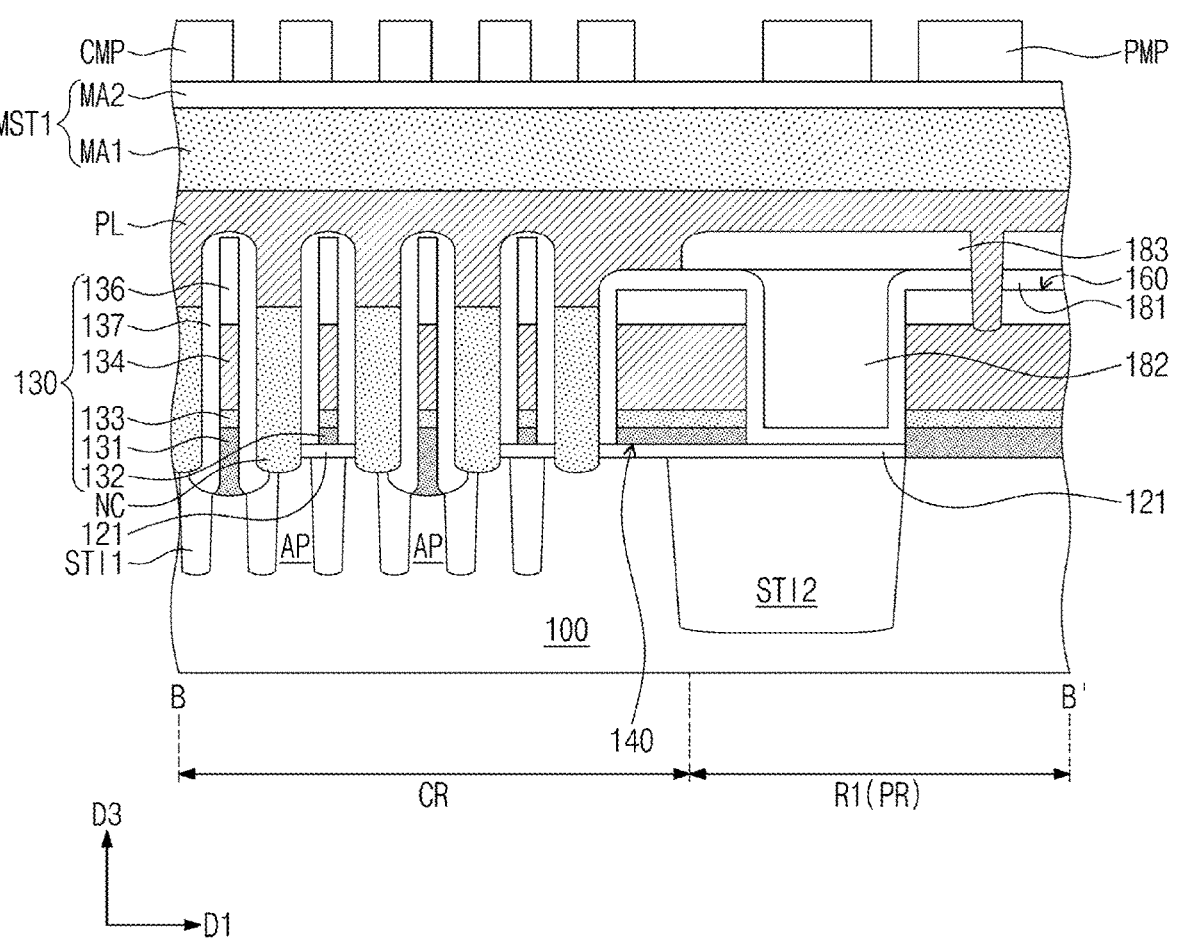
Figure 16C:
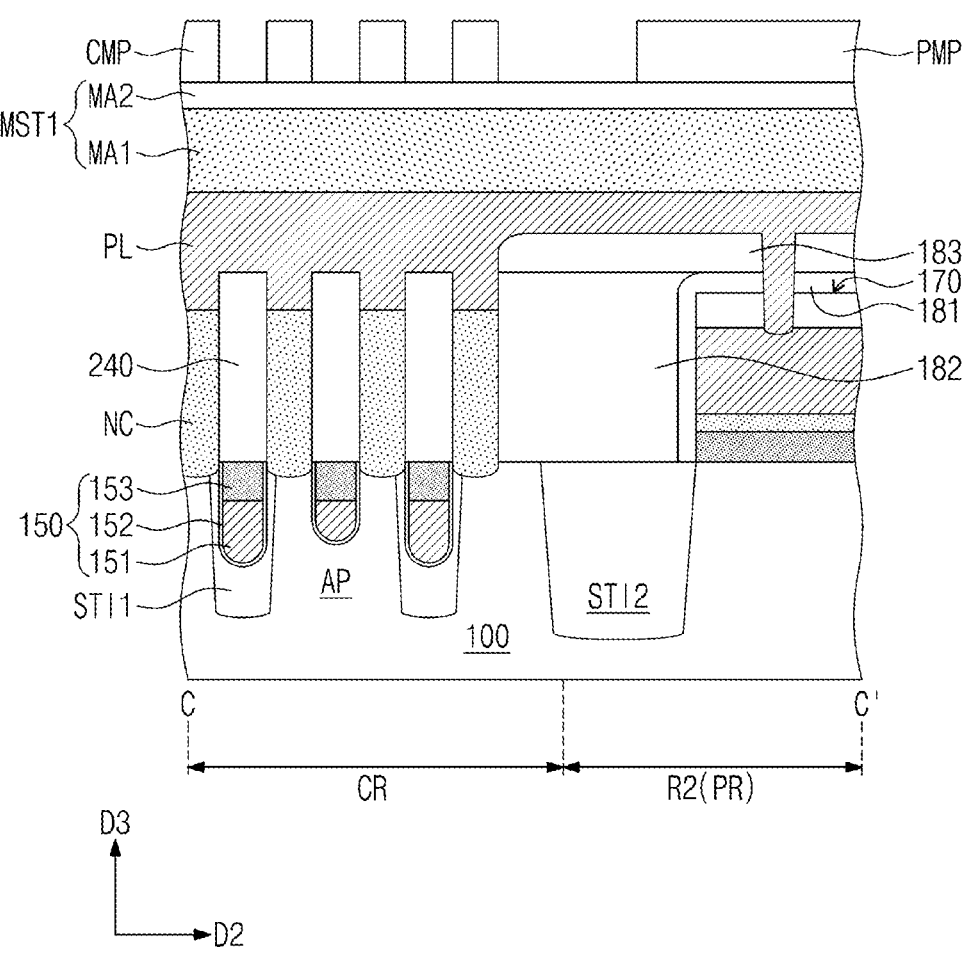

Referring to FIGS. 16A, 16B, and 16C, the second spacer layer SP2 may be etched. The etching process may remove exposed portions of the second spacer layer SP2. The second spacer layer SP2 may include a portion covered with the eighth mask pattern MP8, and the covered portion of the second spacer layer SP2 may not be removed. The second spacer layer SP2 may be etched to form a second space between the seventh and eighth mask patterns MP7 and MP8, and the tenth mask layer MA10 may be exposed through the second space.

The tenth mask layer MA10 may be etched through the second space. The seventh and eighth mask patterns MP7 and MP8 may be used as an etching mask to etch the tenth mask layer MA10. The tenth mask layer MA10 may be etched to form ninth mask patterns. The seventh and eighth mask patterns MP7 and MP8 may be transferred to form the ninth mask patterns. After the formation of the ninth mask patterns, the second spacer layer SP2, the seventh mask patterns MP7, and the eighth mask patterns MP8 may be removed. The seventh and eighth mask patterns MP7 and MP8 may be removed by, e.g., an ashing process. In some embodiments, after the removal of the seventh and eight mask patterns MP7 and MP8, a strip process may be performed.

The ninth mask patterns may be used as an etching mask to etch the ninth mask layer MA9. The ninth mask layer MA9 may be etched to form tenth mask patterns. After the formation of the tenth mask patterns, the ninth mask patterns may be removed.

The tenth mask patterns may be used as an etching mask to etch the line mask patterns LMP (which were formed as line masks patterns by patterning the third mask layer MA3). The line mask patterns LMP may be etched to form cell mask patterns CMP. One line mask pattern LMP may be etched to form a plurality of cell mask patterns CMP (e.g., due to the second line openings LO2 in the second photoresist layer PR2 that intersect the first line openings LO1 in the first photoresist layer PR1). The cell mask patterns CMP may overlap in the third direction D3 with the cell region CR, e.g., the cell mask patterns CMP may have a quadrangular shape in a plan view that are arranged in a matrix pattern (FIG. 16A). In the process that etches the line mask patterns LMP, the peripheral mask patterns PMP may not be etched because of being covered with the tenth mask patterns.

Figure 17A:
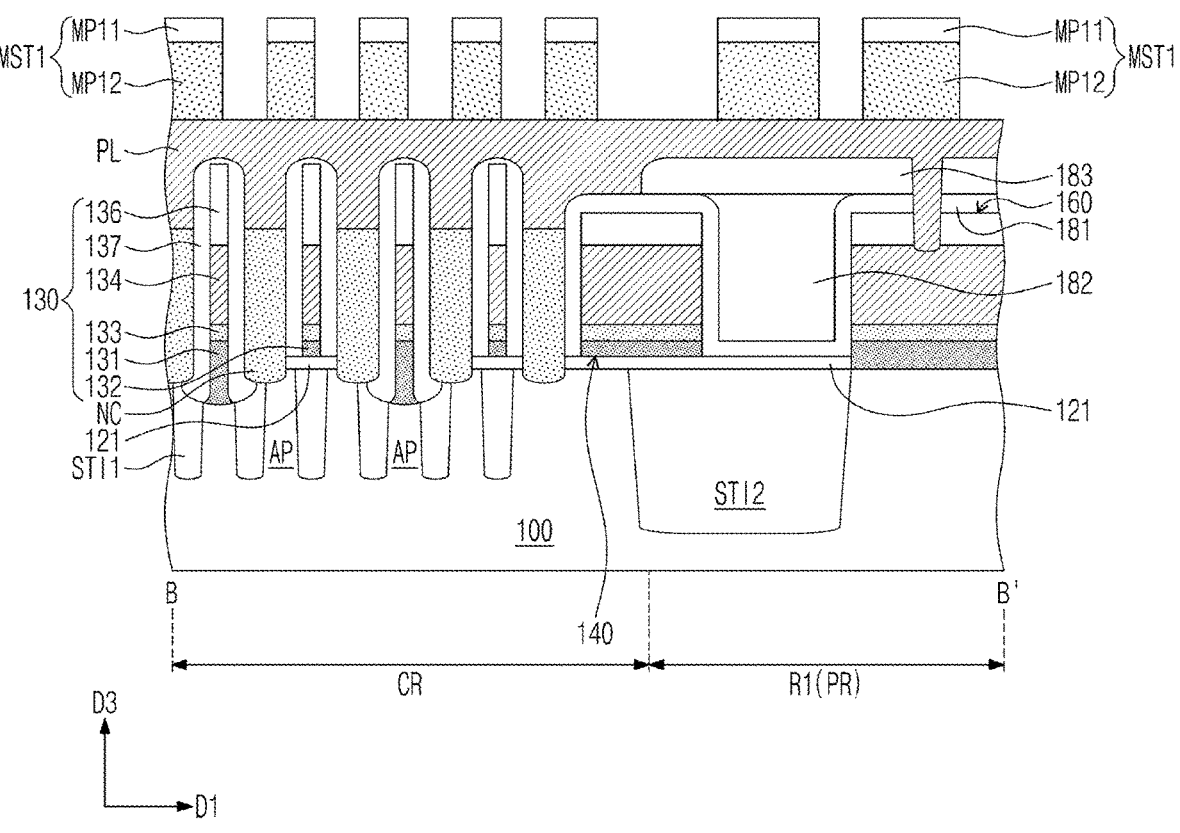
Figure 17B:
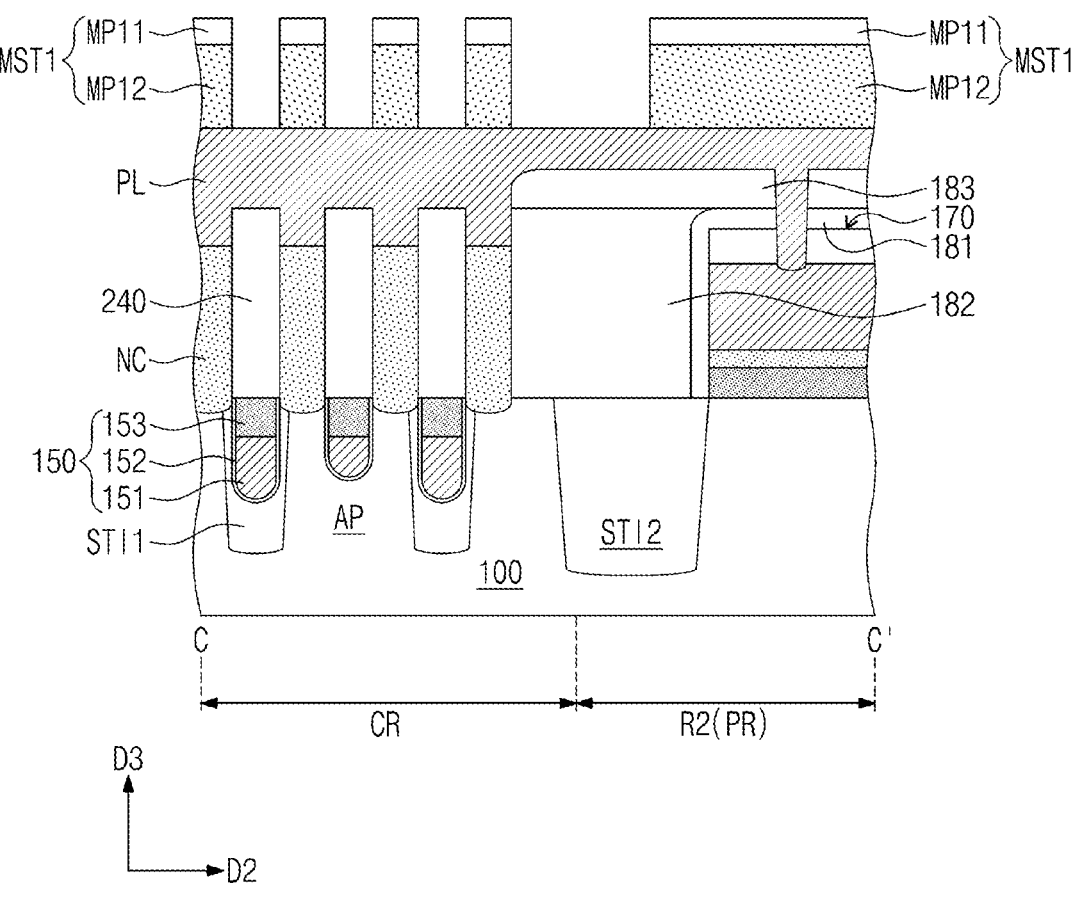

Referring to FIGS. 17A and 17B, the cell mask patterns CMP and the peripheral mask patterns PMP may be used as an etching mask to etch the second mask layer MA2 of the first mask structure MST1. The second mask layer MA2 may be etched to form eleventh mask patterns MP11. The eleventh mask patterns MP11 may be defined to indicate portions of the second mask layer MA2 that are not removed by etching. After the formation of the eleventh mask patterns MP11, the cell mask patterns CMP and the peripheral mask patterns PMP may be removed.

The eleventh mask patterns MP11 may be used as an etching mask to etch the first mask layer MA1. The first mask layer MA1 may be etched to form twelfth mask patterns MP12. The twelfth mask patterns MP12 may be defined to indicate portions of the first mask layer MA1 that are not removed by etching. After the formation of the twelfth mask patterns MP12, the eleventh mask patterns MP11 may be removed.

Figure 18A:
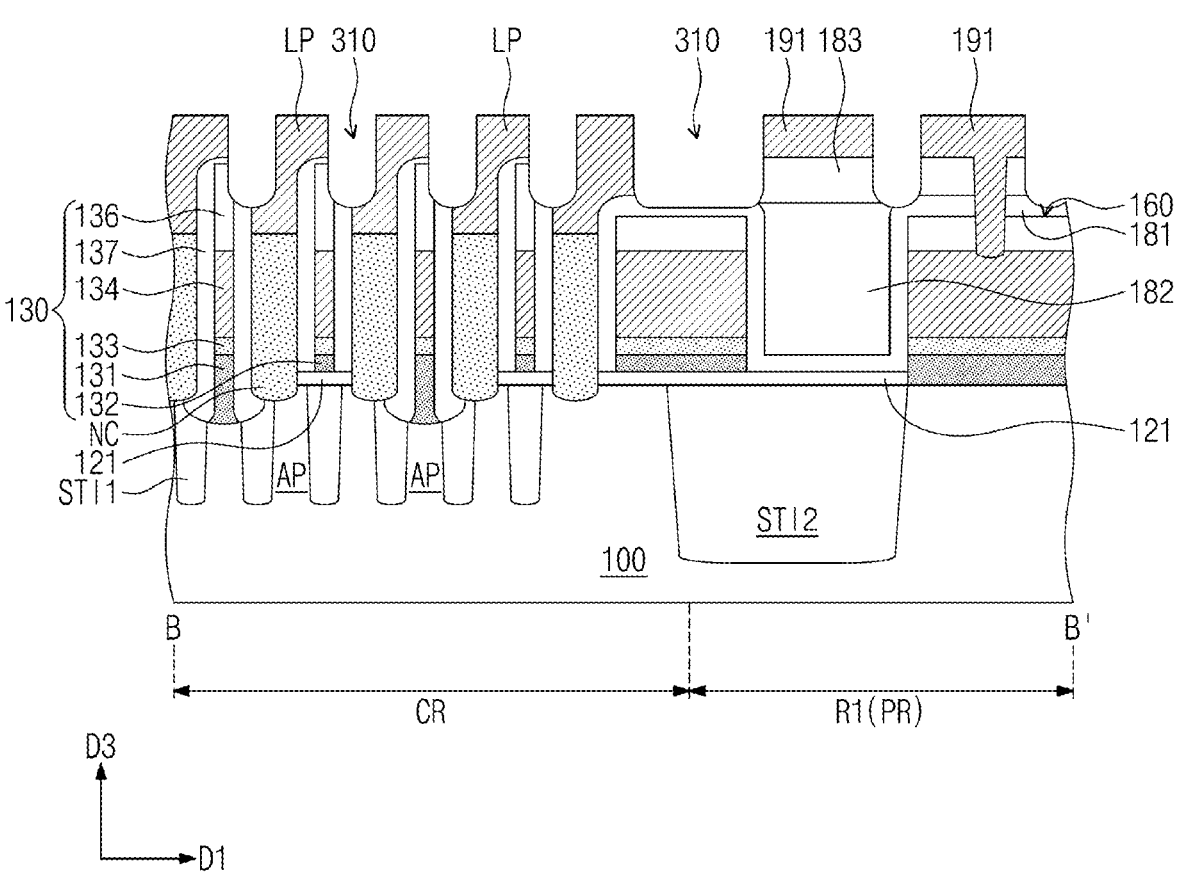
Figure 18B:
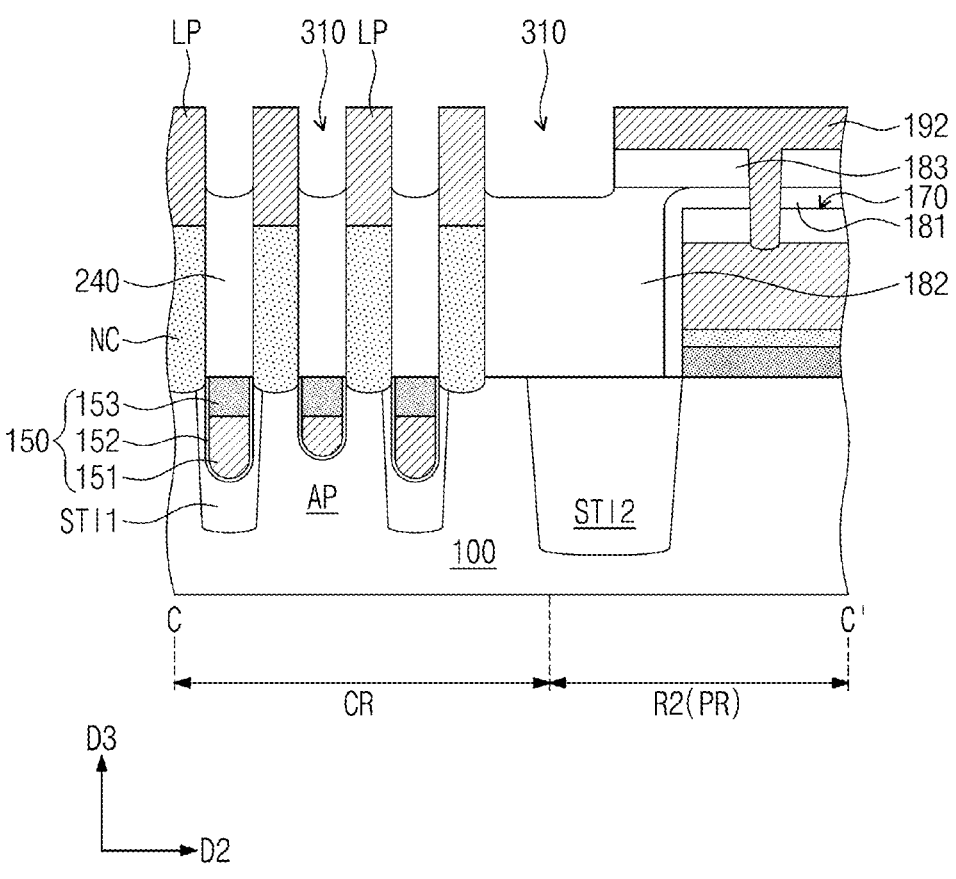

Referring to FIGS. 18A and 18B, the twelfth mask patterns MP12 may be used as an etching mask to etch the preliminary pad layer PL. The etched first mask structure MST1 may be used as an etching mask to etch the preliminary pad layer PL. The preliminary pad layer PL may be etched to form the landing pads LP, the first peripheral conductive pads 191, the second peripheral conductive pads 192, and the third peripheral conductive pads (see 193 of FIG. 1B). The preliminary pad layer PL may be separated into the landing pads LP, the first peripheral conductive pads 191, the second peripheral conductive pads 192, and the third peripheral conductive pads 193.

The preliminary pad layer Pl may be etched to form trenches 310. The trenches 310 may separate from each other the landing pads LP, the first peripheral conductive pads 191, the second peripheral conductive pads 192, and the third peripheral conductive pads 193.

Referring to FIGS. 1B, 1C, and 1D, the first separation structure 250 and the second separation structure 260 may be formed in the trenches 310. The data storage pattern DSP may be formed which is connected to the landing pad LP.

In a method of fabricating a semiconductor device according to some embodiments, the first photoresist layer PR1 may include a peripheral resist pattern PRP and a cell resist pattern CRP that includes a first line opening LO1, which may result in a relative reduction in the number of photoresist layers for fine patterning. Therefore, it may be possible to improve cost and time required for fabricating a semiconductor device. Further, in a method of fabricating a semiconductor device according to some embodiments, because mask patterns are formed in a line-and-space manner, a dose of EUV radiation may be relatively reduced to improve manufacturing cost of semiconductor devices and to form relatively fine patterns.

By way of summation and review, example embodiments provide a semiconductor device having improved electrical properties and increased reliability and a method of fabricating the same. In a method according to example embodiments, the number of photomasks is not increased even using a line-and-space manner (e.g., lines spaced apart from each other) for patterning the landing pads in the cell region (e.g., as opposed to using a mask with a dot-shaped pattern for patterning the landing pads). That is, a same first photomask includes both a pattern for patterning the bar patterns in a peripheral region and a first line pattern for patterning the landing pads in the cell region, and a second photomask includes a second line pattern for patterning the previously patterned landing pads.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
   providing a substrate including a cell region and a peripheral region that surrounds the cell region;
   forming a cell gate structure on the cell region;
   forming a peripheral gate structure on the peripheral region;
   forming a bit-line structure on the cell region;
   forming a preliminary pad layer that covers the bit-line structure and the peripheral gate structure; and
   etching the preliminary pad layer to form a landing pad and a peripheral conductive pad,
   wherein etching the preliminary pad layer includes:
      forming a first mask structure on the preliminary pad layer;
      forming a second mask structure on the first mask structure;
      forming a first photoresist layer on the second mask structure; and
      using the first photoresist layer as an etching mask to etch the second mask structure, and
   wherein the first photoresist layer includes:
      a first line opening that overlaps the cell region; and
      a plurality of peripheral resist patterns that overlap the peripheral region.

2. The method as claimed in claim 1, wherein:
   the bit-line structure extends in a first direction,
   the cell gate structure extends in a second direction that intersects the first direction, and
   the first line opening extends in a third direction that intersects the first direction and the second direction.

3. The method as claimed in claim 1, wherein etching the preliminary pad layer further includes forming on the first mask structure a line mask pattern that overlaps the cell region and a peripheral mask pattern that overlaps the peripheral region.

4. The method as claimed in claim 3, wherein etching the preliminary pad layer further includes etching the line mask pattern to form a plurality of cell mask patterns.

5. The method as claimed in claim 4, wherein etching the preliminary pad layer further includes:
   using the plurality of cell mask patterns and the peripheral mask pattern as an etching mask to etch the first mask structure; and
   using the etched first mask structure as an etching mask to etch the preliminary pad layer.

6. The method as claimed in claim 1, wherein etching the preliminary pad layer further includes:
   forming a third mask structure on the first mask structure;
   forming a second photoresist layer on the third mask structure; and
   using the second photoresist layer as an etching mask to etch the third mask structure.

7. The method as claimed in claim 6, wherein:
   the second photoresist layer includes a second line opening that overlaps the cell region, and
   an extending direction of the first line opening and an extending direction of the second line opening are crossing each other.

8. The method as claimed in claim 1, wherein:
   the landing pad is electrically connected to the cell region, and
   the peripheral conductive pad is electrically connected to the peripheral gate structure.

9. The method as claimed in claim 1, wherein the plurality of peripheral resist patterns are spaced apart from each other.

10. A method of fabricating a semiconductor device, the method comprising:
   providing a substrate including a cell region and a peripheral region that surrounds the cell region;
   forming a cell gate structure on the cell region of the substrate;
   forming a peripheral gate structure on the peripheral region of the substrate;
   forming a bit-line structure on the cell region of the substrate;
   forming a preliminary pad layer that covers the bit-line structure and the peripheral gate structure; and
   etching the preliminary pad layer,
   wherein etching the preliminary pad layer includes:
      forming a first mask structure on the preliminary pad layer;
      simultaneously forming on the first mask structure a line mask pattern that overlaps the cell region and a peripheral mask pattern that overlaps the peripheral region; and
      etching the line mask pattern to form a plurality of cell mask patterns.

11. The method as claimed in claim 10, wherein simultaneously forming the line mask pattern and the peripheral mask pattern includes:
   forming a second mask structure on the first mask structure;
   forming a first photoresist layer on the second mask structure; and
   using the first photoresist layer as an etching mask to etch the second mask structure.

12. The method as claimed in claim 11, wherein the first photoresist layer includes:
   a cell resist pattern that overlaps the cell region; and
   a peripheral resist pattern that overlaps the peripheral region.

13. The method as claimed in claim 12, wherein the cell resist pattern and the peripheral resist pattern are spaced apart from each other.

14. The method as claimed in claim 12, wherein the cell resist pattern includes line openings that extend in a first direction.

15. The method as claimed in claim 14, wherein:
   the cell gate structure extends in a second direction that intersects the first direction, and
   the bit-line structure extends in a third direction that intersects the first direction and the second direction.

16. The method as claimed in claim 11, wherein forming the cell mask patterns includes:

forming a third mask structure on the line mask pattern and the peripheral mask pattern;

forming a second photoresist layer on the third mask structure; and using the second photoresist layer as an etching mask to etch the third mask structure.

17. The method as claimed in claim 16, wherein the second photoresist layer includes line openings that overlap the cell region.

18. The method as claimed in claim 10, wherein etching the preliminary pad layer includes:

using the plurality of cell mask patterns and the peripheral mask pattern as an etching mask to etch the first mask structure; and using the etched first mask structure as an etching mask to etch the preliminary pad layer.

19. A method of fabricating a semiconductor device, the method comprising:

providing a substrate including a cell region and a peripheral region that surrounds the cell region;

forming a cell gate structure on the cell region;

forming a peripheral gate structure on the peripheral region;

forming a bit-line structure on the cell region;

forming a preliminary pad layer that covers the bit-line structure and the peripheral gate structure; and etching the preliminary pad layer to form a landing pad and a peripheral conductive pad, wherein etching the preliminary pad layer includes:

forming a first mask structure on the preliminary pad layer;

forming a second mask structure on the first mask structure;

forming a first photoresist layer on the second mask structure;

using the first photoresist layer as an etching mask to etch the second mask structure;

forming a line mask pattern and a peripheral mask pattern on the first mask structure;

forming a third mask structure on the line mask pattern and the peripheral mask pattern;

forming a second photoresist layer on the third mask structure;

using the second photoresist layer as an etching mask to etch the third mask structure;

etching the line mask pattern to form a cell mask pattern;

using the cell mask pattern and the peripheral mask pattern as an etching mask to etch the first mask structure; and using the etched first mask structure as an etching mask to etch the preliminary pad layer, wherein the first photoresist layer includes:

a first line opening that overlaps the cell region; and a peripheral resist pattern that overlaps the peripheral region, wherein the second photoresist layer includes a second line opening that overlaps the cell region, and wherein an extending direction of the first line opening and an extending direction of the second line opening are crossing each other.

20. The method as claimed in claim 19, wherein:

the first mask structure includes a first mask layer on the preliminary pad layer, and a second mask layer on the first mask layer, the first mask layer includes an amorphous carbon layer, and the second mask layer includes silicon.

\*   \*   \*   \*   \*